(12) United States Patent
Sun

(10) Patent No.: US 10,886,331 B2
(45) Date of Patent: Jan. 5, 2021

(54) MAGNETORESISTIVE DEVICES AND METHODS THEREFOR

(71) Applicant: Everspin Technologies, Inc., Chandler, AZ (US)

(72) Inventor: Jijun Sun, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/380,207

(22) Filed: Apr. 10, 2019

(65) Prior Publication Data

US 2020/0328252 A1   Oct. 15, 2020

(51) Int. Cl.
| | | |
|---|---|---|
| *H01L 27/22* | (2006.01) | |
| *H01L 43/02* | (2006.01) | |
| *H01L 43/08* | (2006.01) | |
| *H01L 43/12* | (2006.01) | |

(52) U.S. Cl.
CPC ............ *H01L 27/228* (2013.01); *H01L 43/02* (2013.01); *H01L 43/08* (2013.01); *H01L 43/12* (2013.01)

(58) Field of Classification Search
CPC .. H01F 10/324; H01F 10/3281; H01F 41/303; H01F 41/32; H03M 2201/818
See application file for complete search history.

(56) References Cited

U.S. PATENT DOCUMENTS

| | | | |
|---|---|---|---|
| 8,686,484 B2 | 4/2014 | Whig et al. | |
| 8,747,680 B1 | 6/2014 | Deshpande et al. | |
| 9,023,216 B2 | 5/2015 | Kochergin et al. | |
| 9,136,464 B1 | 9/2015 | Whig et al. | |
| 9,419,208 B2 | 8/2016 | Whig et al. | |
| 2009/0021250 A1* | 1/2009 | Ikeda | G01N 27/745 324/228 |
| 2016/0079089 A1* | 3/2016 | Koezuka | H01L 21/0214 438/104 |
| 2018/0158498 A1 | 6/2018 | Aggarwal et al. | |
| 2019/0280045 A1* | 9/2019 | Aggarwal | G11C 11/161 |

\* cited by examiner

*Primary Examiner* — Zandra V Smith
*Assistant Examiner* — Andre C Stevenson
(74) *Attorney, Agent, or Firm* — Bookoff McAndrews, PLLC

(57) ABSTRACT

A method of manufacturing a magnetoresistive device may include forming a first ferromagnetic region, forming an intermediate region on or above the first ferromagnetic region. The intermediate region may be formed of a dielectric material and include nitrogen. The method may also include forming a second ferromagnetic region on or above the intermediate region.

19 Claims, 14 Drawing Sheets

MAGNETORESISTIVE DEVICES AND METHODS THEREFOR

TECHNICAL FIELD

The present disclosure relates to, among other things, methods for fabricating magnetoresistive devices and the resulting magnetoresistive devices.

INTRODUCTION

There are many inventions described and illustrated herein, as well as many aspects and embodiments of those inventions. In one aspect, the present disclosure relates to methods of manufacturing magnetoresistive stacks/structures, the resulting magnetoresistive stacks/structures, and devices using the magnetoresistive stacks/structures. In one embodiment, an exemplary magnetoresistive stack/structure of the present disclosure is used in a magnetic tunnel junction magnetoresistive device (MTJ device), such as, for example, a magnetoresistive memory device, magnetoresistive sensor device, magnetoresistive transducer device, etc.

Briefly, an MTJ device (e.g., a magnetoresistive random access memory (MRAM) device) includes a magnetoresistive memory stack/structure having at least one non-magnetic layer (including, for example, one or more dielectric layers) disposed between a "fixed" magnetic region and a "free" magnetic region, each including one or more layers of ferromagnetic materials. Information is stored in the magnetoresistive stack/structure by switching, programming, and/or controlling the direction of magnetization vectors in the magnetic layer(s) of the "free" magnetic region. The direction of the magnetization vectors of the "free" magnetic region may be switched and/or programmed (for example, through spin transfer torque (STT), spin orbit torque (SOT), or a magnetic field generated by electrical current passing through a nearby conductor) by application of a write signal (e.g., one or more current pulses) through (or adjacent, in the case of spin orbit torque, or above or below, in case of switching of the "free" magnetic region by magnetic field generated by electrical current through write lines) to the magnetoresistive memory stack. In contrast, the magnetization vectors in the magnetic layers of a "fixed" magnetic region are magnetically fixed in a predetermined direction. When the magnetization vectors of the "free" magnetic region adjacent to the non-magnetic layer are in the same direction as the magnetization vectors of the "fixed" magnetic region adjacent to the non-magnetic layer, the magnetoresistive memory stack/structure has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack/structure has a second magnetic state. The electrical resistance of the magnetoresistive memory stack/structure (called tunneling resistance) depends on its magnetic state. For example, the first magnetic state may correspond to a state of relatively low(er) electrical resistance and the second magnetic state may correspond to a state of relatively high(er) electrical resistance. The magnetic state of the magnetoresistive memory stack/structure is determined or read based on the resistance of the stack/structure in response to a read current applied through the magnetoresistive stack. Properties such as, for example, magnetoresistance (MR), resistance-area product (RA), delta RA (or change in RA), etc. determine the electrical/magnetic performance of the magnetoresistive memory stack/structure. In some embodiments, the methods of fabricating magnetoresistive stacks/structures described herein provide improvements in at least some of these properties. The scope of the current disclosure, however, is defined by the attached claims, and not by any characteristics of the resulting device or method.

It should be noted that, although exemplary embodiments are described in the context of MTJ stacks/structures, the present inventions may also be implemented in giant magnetoresistive (GMR) stacks/structures where a conductor (e.g., copper) is disposed between two ferromagnetic regions/layers/materials. Indeed, the present inventions may be employed in connection with other types of magnetoresistive stacks/structures wherein such stacks/structures include a "fixed" magnetic region. For the sake of brevity, the discussions and illustrations presented in this disclosure will not be repeated specifically in the context of GMR or other magnetoresistive stacks/structures—but such discussions and illustrations are to be interpreted as being entirely applicable to GMR and other magnetoresistive stacks/structures.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the disclosed magnetoresistive stacks in a particular order of construction (e.g., from bottom to top), it is understood that the depicted magnetoresistive stacks/structures may have a different order (e.g., the opposite order (i.e., from top to bottom)). For example, a "fixed" magnetic region may be formed on or above a "free" magnetic region or layer, which in turn may be formed on or above an insertion layer of the present disclosure.

Figure 1:
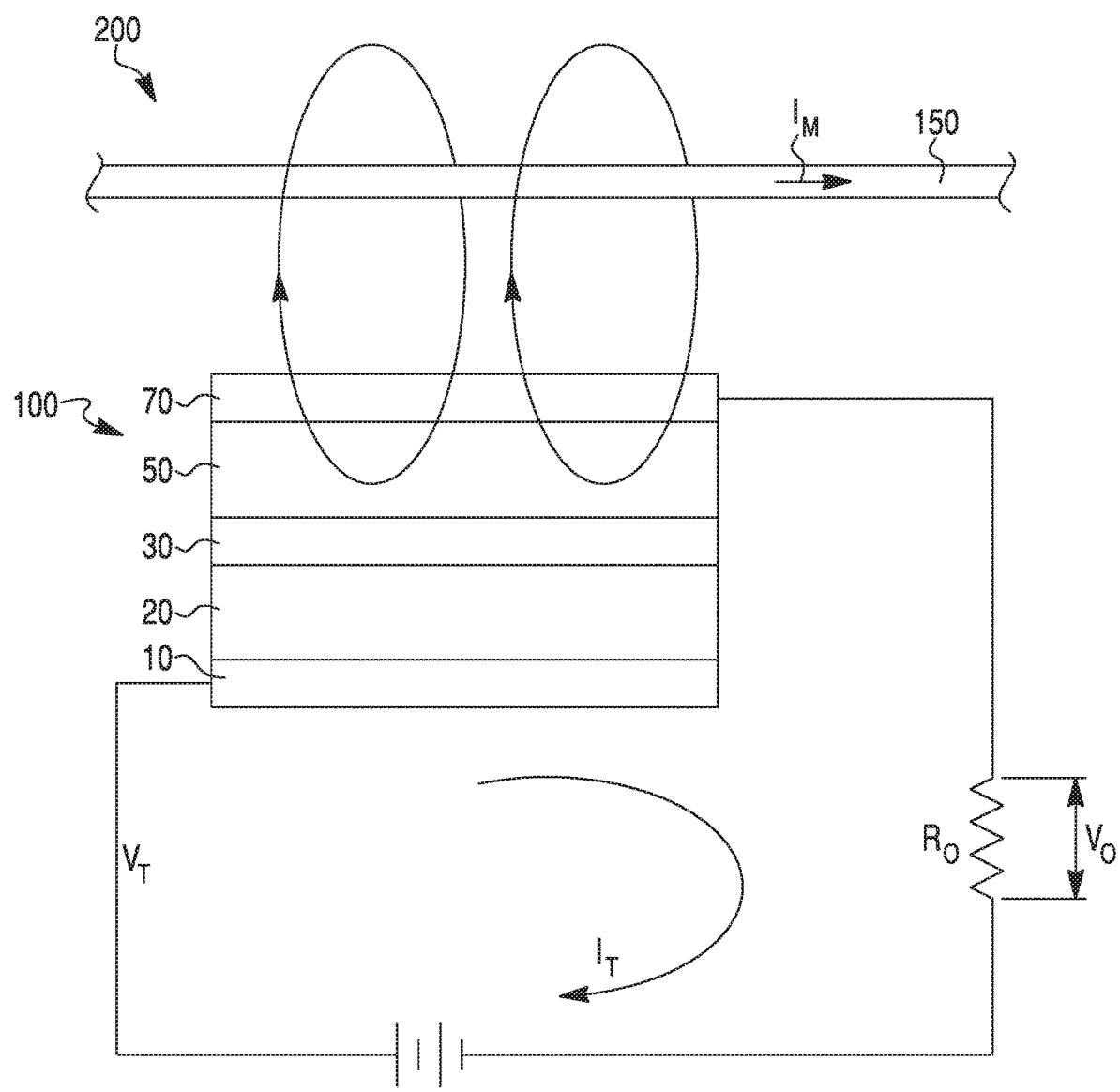
Figure 2A:
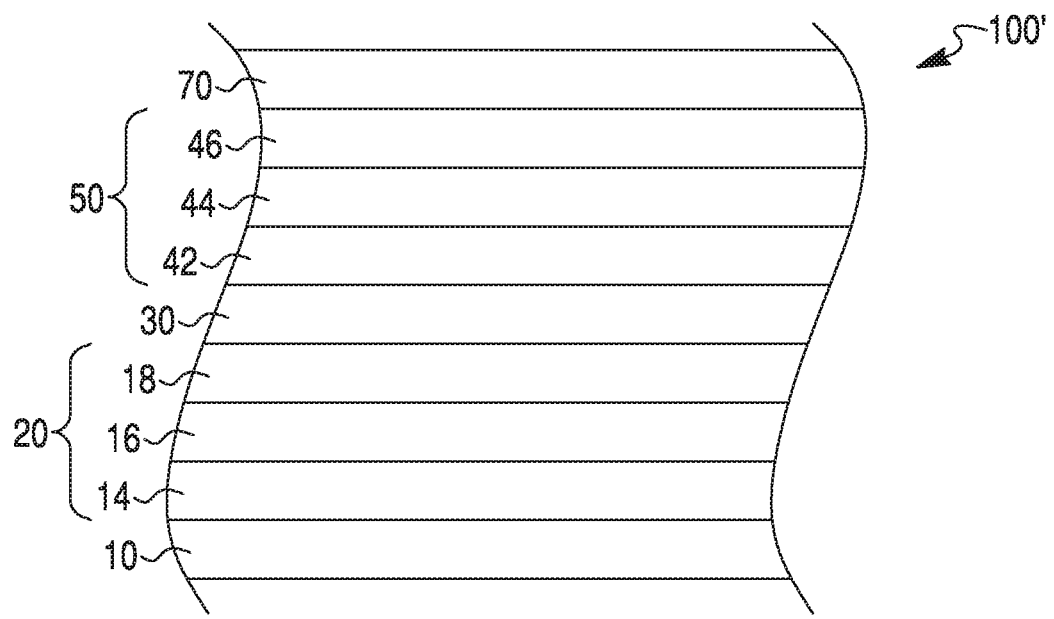
Figure 2B:
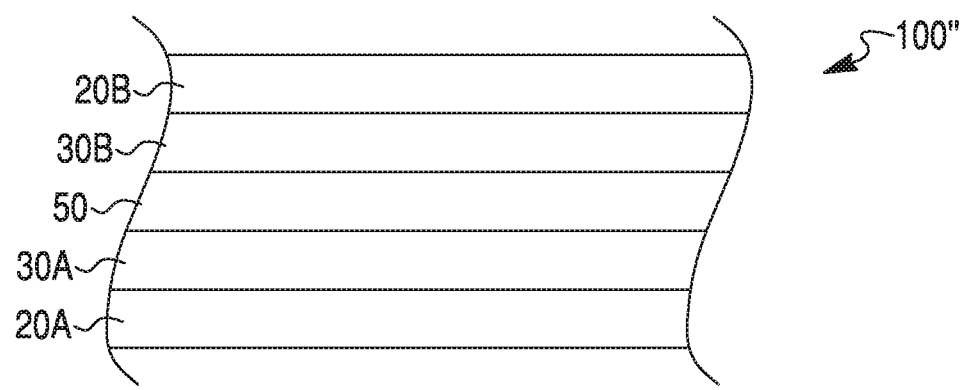
Figure 3:
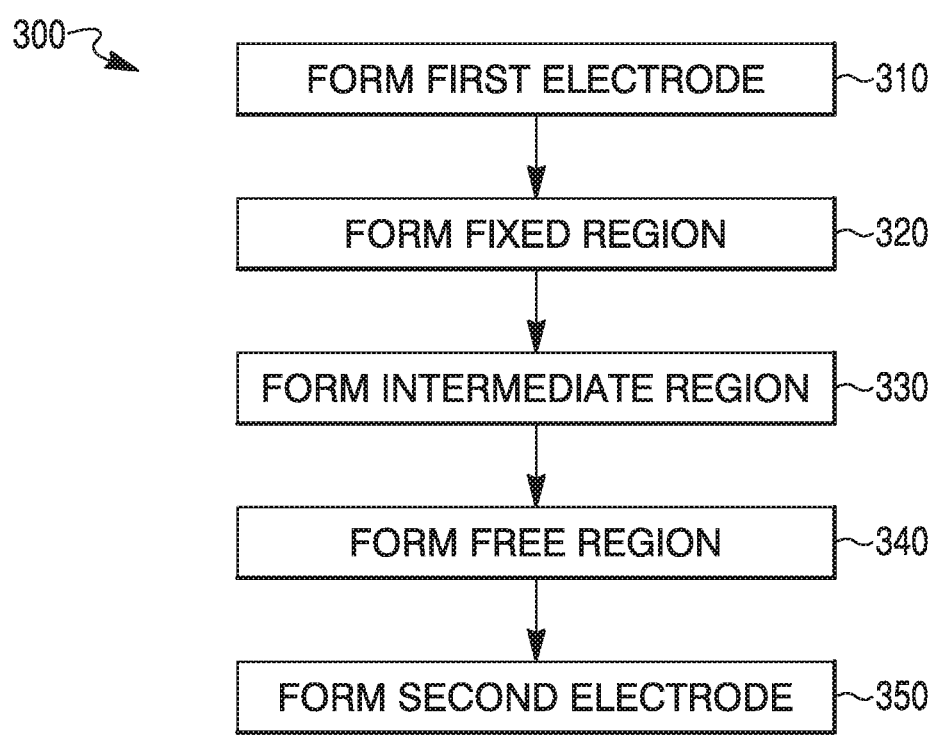
Figure 4:
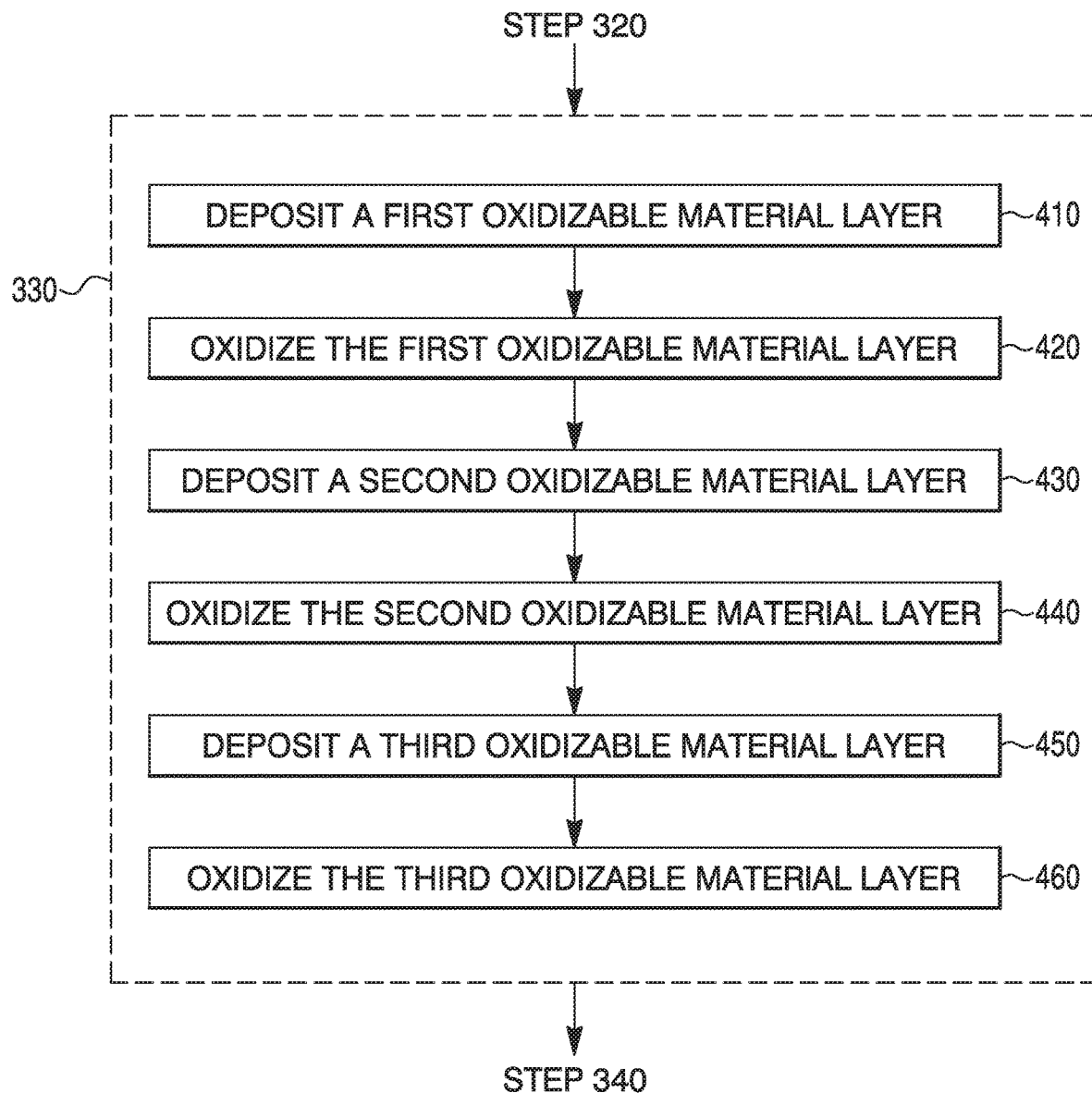
Figure 5A:
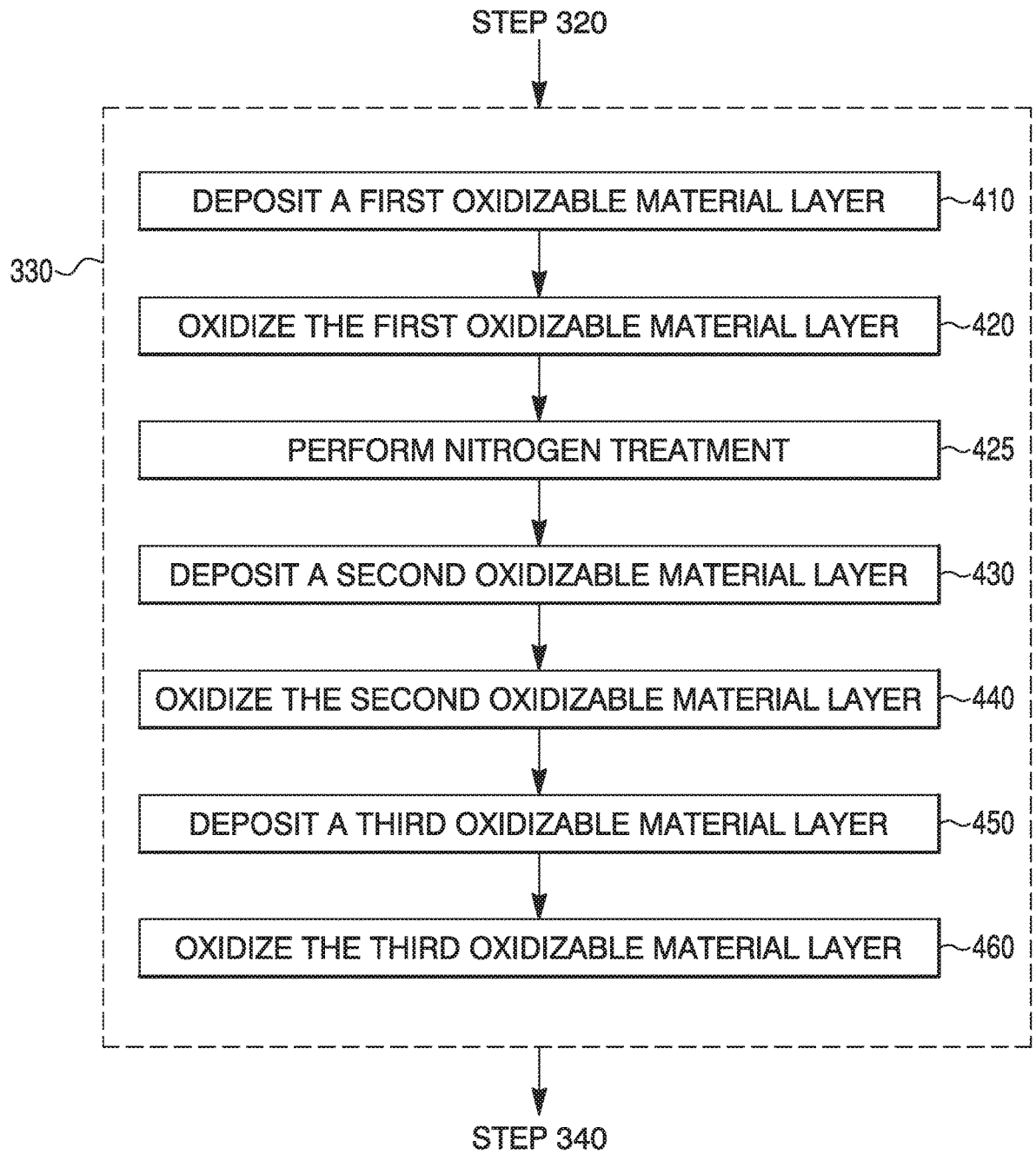
Figure 5B:
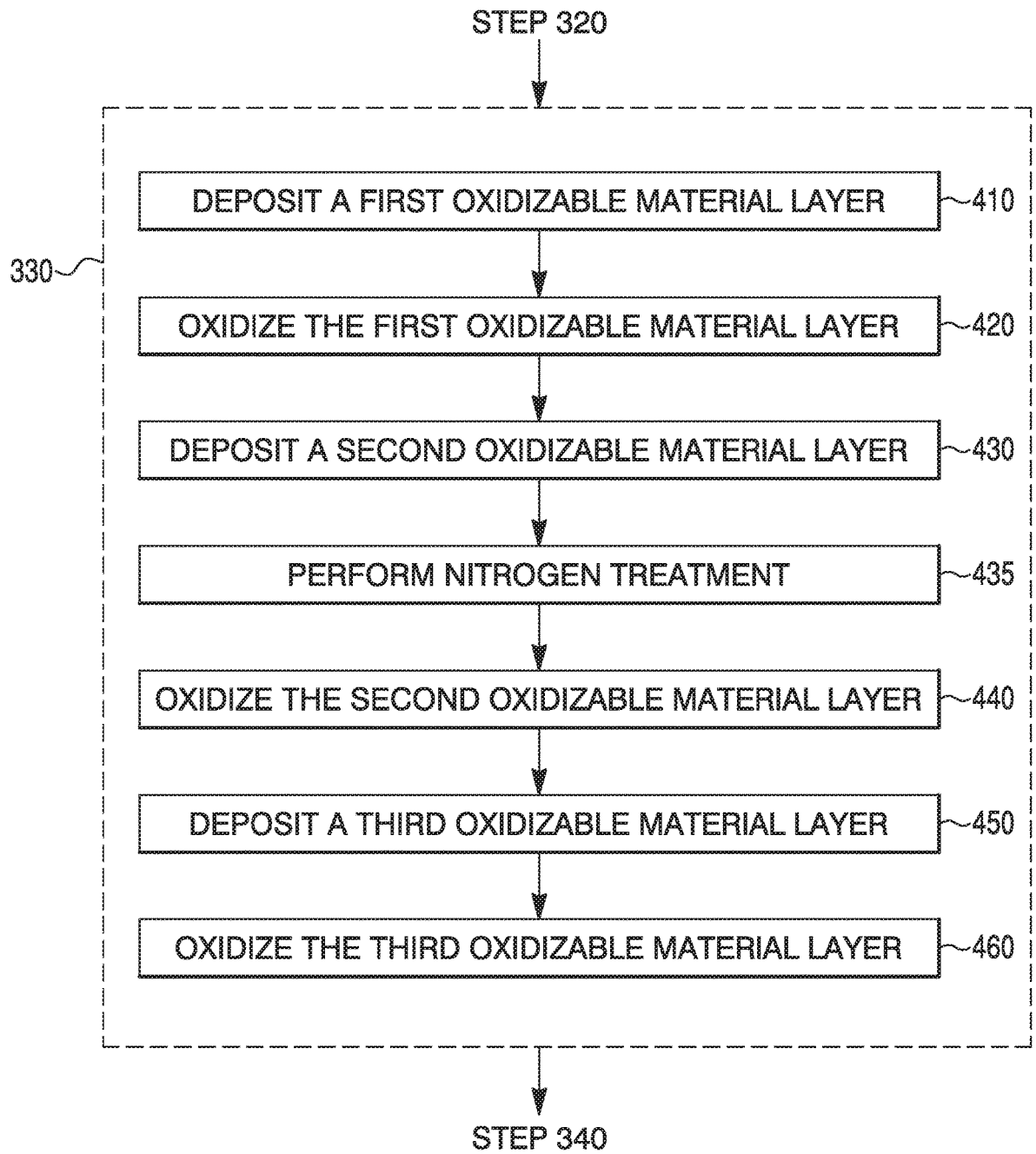
Figure 5C:
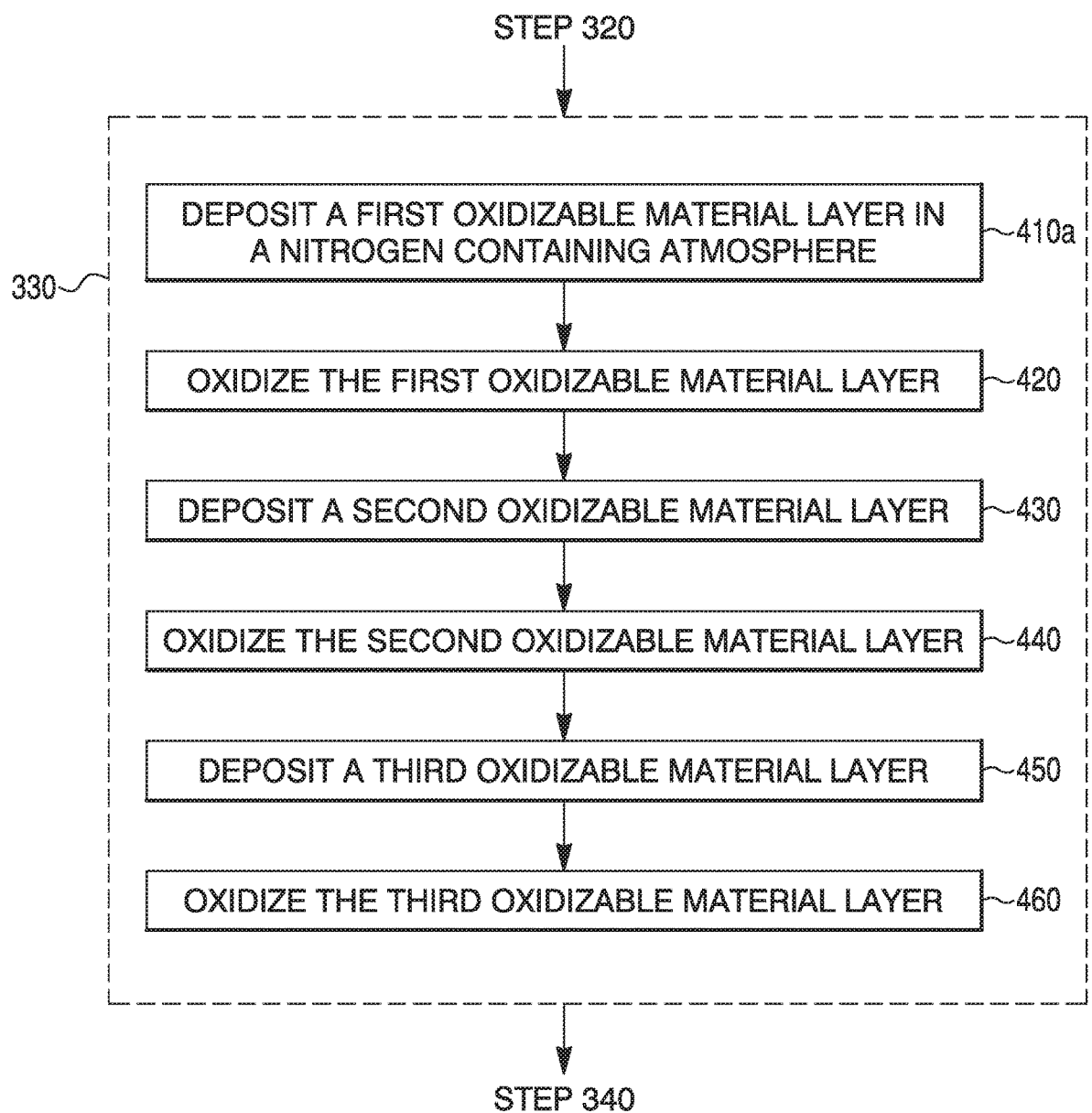
Figure 7:
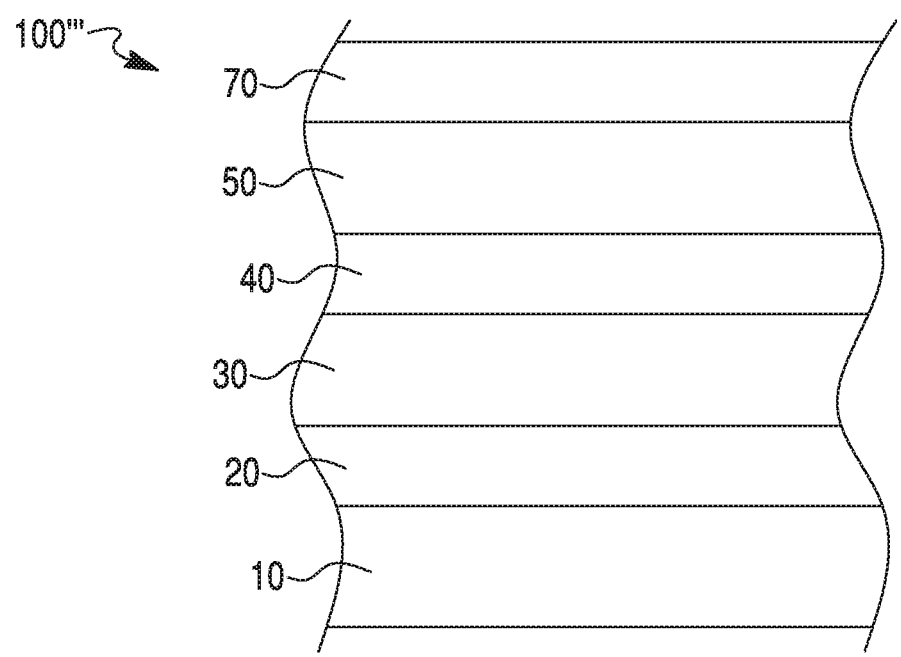
Figure 8:
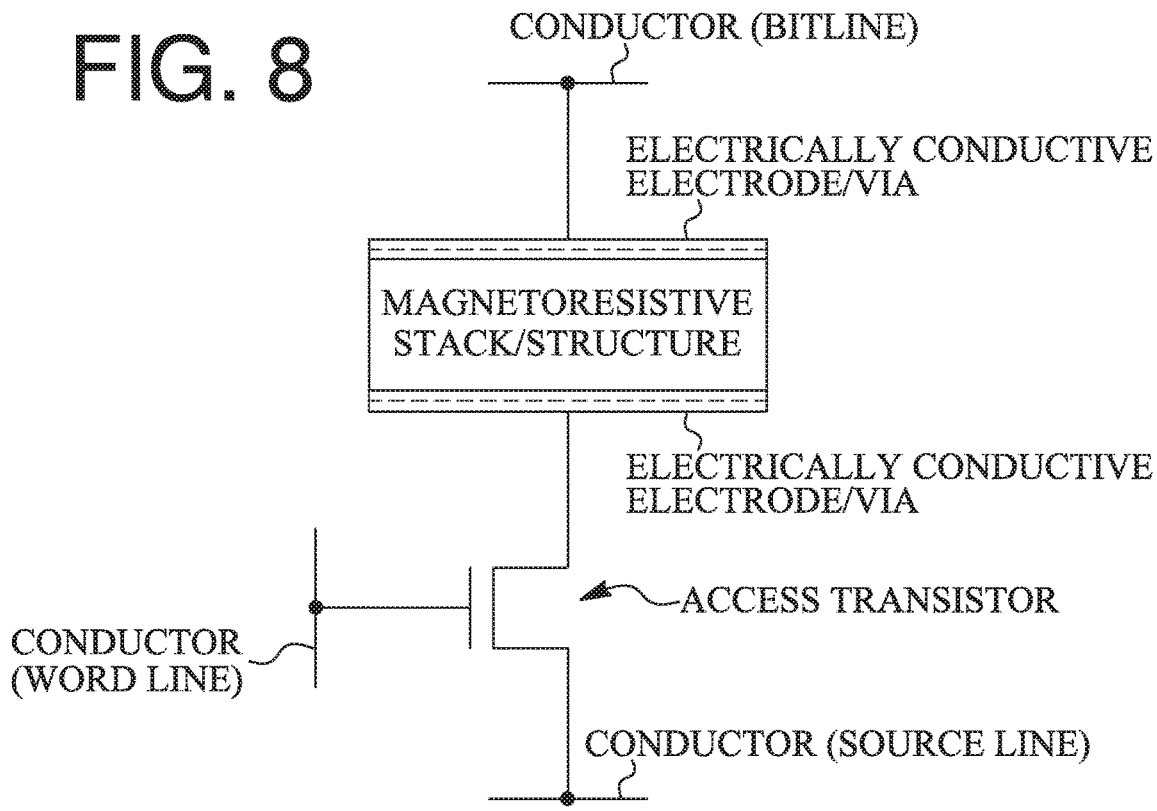
Figure 9A:
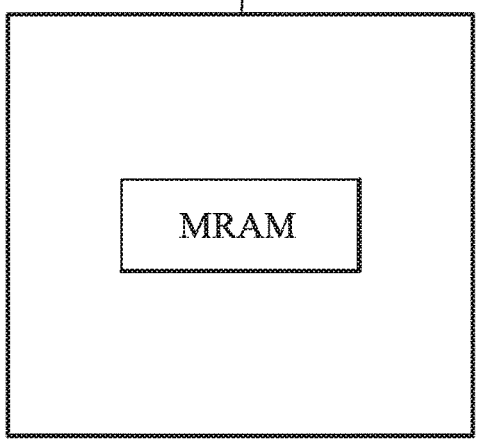
Figure 9B:
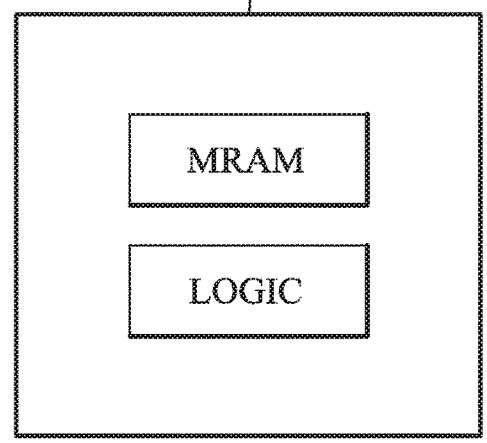

FIG. 1 is a simplified schematic diagram of the electrical circuit of an exemplary magnetic tunnel junction type magnetoresistive device having an exemplary magnetic tunnel junction bit;

FIGS. 2A-2B illustrate cross-sectional views showing different exemplary stack/structures of the magnetic tunnel junction bit of FIG. 1;

FIG. 3 is a flow chart of an exemplary method of fabricating the magnetic tunnel junction bit of FIG. 1;

FIG. 4 is a flow chart of an exemplary method of fabricating an intermediate region, including a dielectric material, of the magnetic tunnel junction bit of FIG. 1;

FIGS. 5A-5C are flow charts of other exemplary methods of fabricating an intermediate region, including a dielectric material, of the magnetic tunnel junction bit of FIG. 1;

FIGS. 6A-6E illustrate experimental results obtained using exemplary magnetoresistive devices according to certain embodiments of the present disclosure;

FIG. 7 illustrates a cross-sectional view of another exemplary stack/structure of the magnetic tunnel junction bit of FIG. 1;

FIG. 8 is a schematic diagram of an exemplary magnetoresistive memory stack/structure electrically connected to an access transistor in a magnetoresistive memory cell configuration; and FIGS. 9A-9B are schematic block diagrams of integrated circuits including a discrete memory device and an embedded memory device, each including an MRAM (which, in one embodiment, is representative of one or more arrays of MRAM having a plurality of magnetoresistive memory stacks), according to aspects of certain embodiments of the present disclosure.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1 t) to (t+0.1 t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive stacks are referred to by specific names (capping region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the "free" region is depicted as being "above" an intermediate region, in some aspects the entire magnetoresistive stack may be flipped such that the intermediate region is "above" the "free" region.

In the exemplary embodiments described herein, the disclosed magnetoresistive stacks/structures are described as including an intermediate region made of an electrically insulating or dielectric material positioned (or sandwiched) between two ferromagnetic regions to form a magnetic tunnel junction (MTJ) device or an MTJ-type device. However, as previously explained, in some embodiments, the intermediate region may be a non-magnetic, electrically conductive material (e.g., copper, gold, or alloys thereof), and the magnetoresistive stack may form a giant magnetoresistance (GMR) or GMR-type device. For simplicity, in the discussion below, a magnetoresistive stack/structure is referred to as a magnetorestsitive stack or as an MTJ stack. Of the two ferromagnetic regions disposed on either side of the intermediate region in an MTJ stack, one ferromagnetic region may be a magnetically "fixed" (or pinned) region, and the other ferromagnetic region may be a magnetically "free" region. The term "free" is intended to refer to ferromagnetic regions having a magnetic moment that may shift or move significantly in response to applied magnetic fields or spin-polarized currents used to switch the magnetic moment vector of the "free" region. On the other hand, the words "fixed" and "pinned" are used to refer to ferromagnetic regions having a magnetic moment vector that does not move substantially in response to such applied magnetic fields or spin-polarized currents. For the sake of simplicity, in the discussion below, the magnetically "fixed" region of an MTJ stack is simply referred to as the fixed region, and the magnetically "free" region is simply referred to as the free region.

FIG. 1 is a simplified schematic diagram of an electrical circuit for an exemplary MTJ device 200 that includes an exemplary MTJ bit 100 (e.g., comprising an MTJ stack) and a magnetic field source 150. It should be noted that although only a single MTJ bit 100 is illustrated in FIG. 1, as would be recognized by a person of ordinary skill in the art, MTJ device 200 may include a plurality of MTJ bits 100 arranged in, e.g., a MRAM array. MTJ bit 100 comprises a fixed region 20 made of a ferromagnetic material separated from a free region 50 made of a ferromagnetic material by an intermediate region 30 made of a dielectric material. The dielectric intermediate region 30 serves as a tunnel barrier layer of MTJ device 200. As illustrated in FIG. 1, fixed region 20, intermediate region 30, and free region 50 form a metal-insulator-metal sandwich structure. In the exemplary embodiment illustrated in FIG. 1, MTJ bit 100 includes a bottom electrode 10 and a top electrode 70 provided on either side of the metal-insulator-metal structure. In some embodiments, one or both of the bottom and top electrodes 10, 70 may be eliminated. In some embodiments, the fixed region 20 may include a pinning region next to, or proximate, bottom electrode 10. A tunneling current $I_T$ can flow through MTJ bit 100 in response to a voltage $V_T$ applied across electrodes 10, 70. A resistor $R_o$ is provided in series with MTJ bit 100 to measure the electrical response ($I_T$) of MTJ bit 100 to applied voltage $V_T$. The ratio $V_T/I_T$ defines the tunneling resistance $R_T$ of MTJ bit 100. Tunneling resistance $R_T$ can have different values depending upon the relative orientation of the magnetization direction of free region 50 with respect to fixed region 20.

When the magnetization direction of free region 50 is parallel to that of fixed region 20, $R_T$ may have a relatively low value $R_{T-Min}$ (minimum tunneling resistance), and when the magnetization direction of free region 50 is anti-parallel to that of fixed region 20, $R_T$ may have a relatively higher value $R_{T-Max}$ (maximum tunneling resistance). The magnetization direction of free region 50 can be changed (e.g., to be parallel or anti-parallel to that of fixed region 20) by, for example, the magnetic field generated by passing a current $I_M$ through a nearby conductor 150, or spin-transfer-torque by passing an electrical current through MTJ bit 100, or spin-orbit-torque by passing an electrical current through a layer (not shown in FIG. 1) in contact with free region 50 (FIG. 1) in MTJ bit 100.

MTJ device 200 can function as a memory or a sensor by measuring the resistance $R_T$ of its MTJ bit 100. The ratio of the change in resistance $R_T$ of MTJ bit 100 is called magnetoresistance ratio (MR=$(R_{T-max}-R_{T-Min})/R_{T-Min}$). For increased sensitivity of MTJ device 200 (e.g., a device with a good read signal), a bigger difference between $R_{T-Min}$ and $R_{T-Max}$, and thus a larger MR, is desirable. It is known that a substantially defect-free intermediate region 30 (e.g., tunnel barrier layer) improves the performance of MTJ device 200. At the same time, the process of forming the tunnel barrier layer must be relatively simple and amenable to mass fabrication techniques (e.g., not involve inordinate amounts of time, use standard fabrication equipment/processes, etc.) to lower costs. In MTJ device 200, the occurrence of individual MTJ bits 100 with low MR values (that may indicate a hard or a partial electrical short) may result in low manufacturing yields and thus increased cost.

The structure of MTJ bit 100 illustrated in FIG. 1 is only exemplary. In general, MTJ bit 100 can have any suitable structure. FIG. 2A illustrates another exemplary structure of an MTJ bit 100' that may be used in MTJ device 200 of FIG. 1. As illustrated in FIG. 2A, fixed region 20 and free region 50 of MTJ bit 100' may include multiple regions/layers arranged one over the other to form a stack of layers between bottom and top electrodes 10, 70. Although not shown in FIG. 2A, in some embodiments, MTJ stack 100' may be formed between two metal layers (e.g., M1 and M2 metal layers, M2 and M3 metal layers, etc.) of the MTJ device. For example, bottom electrode 10 may be formed on an interconnect structure of a semiconductor substrate (of MTJ device) that is in electrical contact with, for example, CMOS circuitry (e.g., transistors, etc.) on the substrate. Bottom and top electrodes 10, 70 may comprise an electrically conductive material (e.g., tantalum (Ta), titanium (Ti), tungsten (W), or an alloy of these elements (e.g., tantalum-nitride alloy), etc.). In some embodiments, one or both of bottom electrode or top electrode 10, 70 may be eliminated.

In MTJ bit 100' of FIG. 2A, fixed region 20 includes two ferromagnetic regions 14 and 18 separated by an antiferromagnetic coupling region 16. Ferromagnetic regions 14, 18 may include one or more of nickel, iron, cobalt, or boron, including their alloys, or engineered materials with one or more of the elements palladium (Pd), platinum (Pt), chromium (Cr), and alloys thereof. Coupling region 16 may include, for example, iridium (Ir), ruthenium (Ru), rhenium (Re), or rhodium (Rh). In some embodiments, one or both of ferromagnetic regions 14, 18 may include cobalt (Co), iron (Fe), and/or boron (B) in, e.g., an alloy such as CoFeB. Although not shown in FIG. 2A, in some embodiments, fixed region 20 may also include a transition region and/or a reference region disposed on or above region 18 to facilitate/improve the growth of the overlying intermediate region 30. In some embodiments, fixed region 20 also may include one or more non-magnetic material layers, such as, for example, ruthenium, rhodium, platinum, palladium, rhenium, iridium, copper, aluminum, tantalum, titanium, niobium, vanadium, zirconium, iridium, one or more alloys of these elements, and in certain embodiments, tungsten and molybdenum. In some embodiments, fixed region 20 also may include an antiferromagnetic pinning layer including materials such as, for example, a platinum manganese alloy (PtMn), an iridium manganese alloy (IrMn), a platinum palladium manganese alloy (PtPdMn), a nickel manganese alloy (NiMn), etc. Although not a requirement, typically fixed region 20 may have a thickness between approximately 8-300 Å, between approximately 15-110 Å, greater than or equal to 8 Å, greater than or equal to 15 Å, less than or equal to 300 Å, or less than or equal to 110 Å.

Free region 50 may include ferromagnetic regions 42 and 46 separated by an insertion region 44 that provides ferromagnetic or antiferromagnetic coupling between ferromagnetic regions 42, 46. Ferromagnetic regions 42, 46 may include alloys of one or more of nickel, iron, and/or cobalt, and in some embodiments, boron. In some embodiments, ferromagnetic regions 42, 46 may include one or more alloys of cobalt, iron, and boron (e.g., CoFeB). Free region 50 also may include an iron rich layer or region disposed between ferromagnetic region 42 and intermediate region 30 and/or between ferromagnetic region 46 and top electrode 70. Insertion region 44 may include any nonmagnetic material, such as, for example, tantalum (Ta), tungsten (W), molybdenum (Mo), ruthenium (Ru), rhodium (Rh), rhenium (Re), iridium (Ir), chromium (Cr), osmium (Os), hafnium (Hf) and their combinations. Although free region 50 of FIG. 2A is illustrated as comprising two ferromagnetic regions 42 and 46 separated by a single insertion region 44, this is only exemplary. In general, free region 50 may have any number of ferromagnetic regions with insertion regions provided between the adjacent ferromagnetic regions. Free region 50 may have any thickness. In some embodiments, free region 50 may have a thickness between approximately 7-130 Å.

Intermediate region 30 may include any dielectric material. In some embodiments, intermediate region 30 may include an oxide material, such as, for example, magnesium oxide $(MgO)_x$ or aluminum oxide $(AlO_x$ (e.g., $Al_2O_3$)). Intermediate region 30 functions as a tunnel barrier in MTJ bit 100'. In general, intermediate region 30 may have any thickness. In some embodiments, intermediate region 30 may have a thickness between approximately 8.5-14.1 Å, preferably between approximately 9.6-13.0 Å, and more preferably between approximately 9.8-12.5 Å. As will be described in more detail below, in some embodiments, intermediate layer 30 may be formed by depositing a layer of material (such as, for example, magnesium, aluminum, etc.) and then oxidizing the deposited material. In some embodiments, this process may include multiple steps of material deposition and oxidation.

Although FIG. 2A (and FIG. 1) illustrates free region 50 as being formed above fixed region 20, this is not a requirement. In some embodiments, fixed region 20 may be formed above free region 50 (with intermediate region 30 positioned between them). In some embodiments, as illustrated in FIG. 2B, an MTJ bit 100" may have a dual spin filter (DSF) structure where two fixed regions 20A, 20B are positioned on either side of a free region 50 with intermediate regions 30A and 30B positioned between the fixed and free regions. The two fixed regions 20A, 20B and/or free region 50 may have a single-layer or a multi-layer structure (for example, as shown in FIG. 2A). The structures of MTJ bits illustrated in FIGS. 1, 2A, and 2B are only exemplary and an MTJ bit of the current disclosure can have any now-known or future developed stack/structure (including one or more synthetic antiferromagnetic (SAF) structures, synthetic ferromagnetic (SyF) structures, etc.). U.S. Pat. Nos. 8,686,484; 8,747,680; 9,023,216; 9,136,464; and 9,419,208, Patent Application Publication No. 2018/0158498, and U.S. patent application Ser. No. 16/188,934 (filed Nov. 13, 2018); Ser. No. 16/202,496 (filed Nov. 28, 2018); Ser. No. 16/179,112 (filed Nov. 2, 2018); Ser. No. 16/175,205 (filed Oct. 30, 2018), and Ser. No. 16/190,299 (filed Nov. 14, 2018), incorporated by reference in their entireties herein, describe exemplary structures that may be used as MTJ bits of the current disclosure.

It should be noted that, although MTJ bits comprising distinct regions (or regions/layers with distinct interfaces) are illustrated in FIGS. 1, 2A, and 2B, this is only exemplary. As known to one skilled in the art, the interface between adjacent regions of a magnetoresistive stack may, in some cases, be characterized by compositional (e.g., chemical) and/or structural changes due to intermixing between the materials (or intermetallic formation) of the adjacent regions (e.g., during deposition, post deposition annealing, etc.). For example, while the compositional profile across an ideal interface (i.e., an interface which does not undergo compositional changes) between two regions (or layers) may indicate a sharp profile (i.e., the composition abruptly changes from the composition of one region to that of the other region), the compositional profile across a typical interface of the illustrated stacks may indicate a different profile. For example, the profile may indicate a gradual change in chemical composition across an interface of two regions if intermixing occurs between the materials of the regions, or the profile across the interface may indicate the presence of a different composition in the vicinity of the interface if a different interfacial phase (e.g., an intermetallic) is formed at the interface.

Exemplary methods of fabricating selected embodiments of the disclosed MTJ bits (e.g., MTJ bits 100, 100', 100", etc.) will now be described. It should be appreciated that the described methods are merely exemplary. In some embodiments, the methods may include a number of additional or alternative steps, and in some embodiments, one or more of the described steps may be omitted. Any described step may be omitted or modified, or other steps added, as long as the intended functionality of the fabricated magnetoresistive stack/structure remains substantially unaltered. Further, although a certain order is described or implied in the described methods, in general, the steps of the described methods need not be performed in the illustrated and described order. Further, the described methods may be incorporated into a more comprehensive procedure or process having additional functionality not described herein.

FIG. 3 depicts a flow chart of an exemplary method 300 of fabricating MTJ bit 100 (of FIG. 1), according to the present disclosure. In the discussion below, reference will be made to both FIGS. 1 and 2A-2B. A first electrode (e.g., bottom electrode 10) may be first formed on the backend (surface with circuitry) of a semiconductor substrate by any suitable process (step 310). A fixed region 20 then may be formed on or above an exposed surface of electrode 10 (step 320). In embodiments where fixed region 20 is a multi-layer stack that includes multiple stacked regions (e.g., see FIG. 2A), fixed region 20 may be formed by providing (e.g., sequentially) the different regions (e.g., regions 14, 16, and 18 of FIG. 2A) that comprise fixed region 20 on or above the surface of electrode 10. In some embodiments, fixed region 20 also may be formed by providing an antiferromagnetic pinning layer between region 14 and bottom electrode 10. An intermediate region 30 then may be formed on or above an exposed surface of fixed region 20 (step 330). A free region 50 may then be formed on or above the exposed surface of the intermediate region 30 (step 340). Although not a requirement, in some embodiments, a barrier layer may be formed between intermediate region 20 and free region 50. In embodiments where a barrier layer is provided, the barrier layer may be formed of material(s) that prevents or reduces the migration of one or more materials in the intermediate region 30 into free region 50. In embodiments where free region 50 is a multi-layer stack, free region 50 may be formed by providing (e.g., sequentially providing) the different regions (e.g., regions 42, 44, and 46 of FIG. 2A) that comprise the stack of free region 50. Second electrode 70 may now be formed on an exposed surface of free region 50 (step 350). As those of ordinary skill in the art will readily recognize, method 300 may be appropriately modified to provide for the formation of any additional layers or regions.

Any suitable process may be used to form the different regions of MTJ bit 100. In some embodiments, forming the different regions may include depositing the material of the region by, for example, physical vapor deposition (e.g., ion beam sputtering, magnetron sputtering, etc.), chemical vapor deposition, plasma-enhanced chemical vapor deposition, etc. Formation of some or all of the regions may also involve known processing steps such as, for example, selective deposition, photolithography processing, etching, annealing, etc., in accordance with any of the various conventional techniques known in the semiconductor industry. In some embodiments, during deposition of the fixed and free regions 20 and 50, a magnetic field may be applied to set a preferred easy magnetic axis of the region (e.g., via induced anisotropy). Similarly, a strong magnetic field applied during the post-deposition high-temperature anneal step may be used to induce a preferred easy magnetic axis and a preferred pinning direction for any antiferromagnetically pinned materials or exchange coupled pinning materials. Since these techniques are known to those of ordinary skill in the art, they are not described here in greater detail.

In some embodiments, forming intermediate region 30 (i.e., step 330 of FIG. 3) may include directly depositing an insulating material (e.g., using physical vapor deposition from an oxide target) on a surface of fixed region 20. In some embodiments, forming intermediate region 30 may include deposition of an oxidizable metal film or layer followed by oxidation of the deposited film. In some embodiments, forming intermediate region 30 (i.e., step 330 of FIG. 3) may include multiple steps of oxidizable metal deposition and oxidation of the deposited metal. For example, with reference to FIG. 1, a first layer of an oxidizable metal may be deposited on an exposed surface of fixed region 20 and the deposited metal may be oxidized (fully or partially). A second layer of oxidizable metal (same of different material as the first layer) may then be deposited on oxidized metal oxide layer and oxidized. Several such deposition and oxidation steps may be carried out to form intermediate region 30.

FIG. 4 is a flow chart of an exemplary method 400 of forming intermediate region 30 (i.e., step 330 of FIG. 3). A first layer of an oxidizable material (for example, an oxidizable metal such as magnesium (Mg), aluminum (Al), etc.) is formed (e.g., sputter deposited, etc.) on or above a surface of fixed region 20 (step 410). The deposited layer is then oxidized (step 420) to at least partially convert the deposited first layer of oxidizable material to a metal oxide (magnesium oxide (MgO), aluminum oxide ($Al_2O_3$), etc.). The oxidization in step 420 is accomplished, for example, by using at least one of natural oxidation, exposure to oxygen radicals, an argon and oxygen plasma, or remote oxygen plasma. In one embodiment, the oxidation dose (or oxygen dose) during the oxidation step is controlled by a combination of the time of exposure, pressure, concentration of oxygen in the oxidation gas, time of exposure to the oxidation gas, etc. For other techniques, other parameters well known in the art, such as RF power, etc. may be used to control the oxygen dose. A second layer of oxidizable material may then be formed (e.g., deposited) on the oxidized first layer (step 430). The deposited second layer is then oxidized to at least partially convert the deposited second layer of oxidizable material to a metal oxide (step 440). Similar to the oxidization in step 420, the oxidization of the deposited second layer in step 440 may be accomplished, for example, by using at least one of natural oxidation, exposure to oxygen radicals, an argon and oxygen plasma, and an ion beam. A third layer of oxidizable material may then be deposited on the oxidized second layer (step 540). The deposited third layer of oxidizable material may then be at least partially oxidized to form a metal oxide. Similar to oxidization step 420 and 440, the oxidization in step 460 may be accomplished, for example, by using at least one of natural oxidation, exposure to oxygen radicals, an argon and oxygen plasma, and a remote oxygen plasma. Thus, in some embodiments, intermediate region 30 is formed by deposing and then oxidizing three layers of an oxidizable metal material. It should be noted that, in general, intermediate region 30 may be formed using any number of cycles (e.g., 1-10) of material deposition and oxidation.

In some embodiments, formation of the first, second, and third layers of oxidizable material in steps 410, 430, and 450 may be performed using a physical vapor deposition process (such as, for example, ion beam deposition, molecular beam epitaxy, magnetron sputtering, etc.). Although not a requirement, in some embodiments, the same oxidizable material (e.g., Al, Mg, etc.) may be deposited as the first, second, and third layers of oxidizable material. Any desired thickness or quantity of the oxidizable material may be deposited as the first, second, and third layers of oxidizable material. In some embodiments, each of the first, second, and third layers may have thickness of about 1 to 10 Angstroms, and preferably about 3 to 6 Angstroms. In some embodiments, the thickness of the deposited individual layers may be such that the total thickness of the finally formed intermediate layer 30 is the desired value. In some embodiments, the total thickness of the deposited individual layers may be different from the desired thickness of intermediate region 30 to account for a change in thickness during oxide formation.

In some embodiments, the oxidation dose (achieved, for example, by a combination of the time of exposure to oxidation gas, pressure of the gas, concentration of oxygen in the oxidation gas, flow rate of oxidation gas, etc.) during oxidation of the first, second, and third layers of oxidizable material (i.e., in steps 420, 440, 460) may be substantially the same. In some embodiments, the oxidation dose may be expressed as the product of the oxygen flow rate in sccm (standard cubic centimeters per minute) and the time of exposure in seconds. In some embodiments, the first layer of oxidizable material may be oxidized in step 420 using a first oxidation dose, the second layer of oxidizable material may be oxidized in step 440 using a second oxidation dose, and the third layer of oxidizable material may be oxidized in step 460 using a third oxidation dose. In some embodiments, the first, second, and third oxidation doses may be, respectively, the lowest dose, the highest dose, and an intermediate dose between the lowest and highest doses. In some embodiments, the second oxidization dose may be at least 100 times greater than the first oxidization dose and preferably at least 1000 times greater. In some embodiments, the second oxidization dose may be chosen based on the desired tunnel-barrier resistance (e.g., the desired resistance time area product or RA). In some embodiments, the third oxidation dose may be at least 5 times greater than the first oxidization dose or preferably at least 10 times greater.

As explained previously, in general, any type of oxidation may be used in steps 420, 440, and 460 to oxidize the deposited oxidizable material. In some embodiments, the oxidation steps (for example, the last oxidation) can be eliminated. In some embodiments, the oxidizable material may be oxidized using natural oxidation. Oxidation at temperatures less than about 35° C. is referred to as low temperature or natural oxidation because it resembles (in speed and self-limiting behavior) the oxidation that occurs during exposure to air (e.g., clean-room air) at room temperatures. In general, during natural oxidation, the deposited material is exposed to an oxygen containing atmosphere at a pressure between about 0.03-10 milli-Torr at a temperature less than about 35° C. In some embodiments, natural oxidation may include exposing the deposited oxidizable material to substantially pure oxygen or a mixture of oxygen with other gases (e.g., 2-80% oxygen in nitrogen), at a pressure of about 0.03-0.05 milli-Torr or less, for about 5-100 seconds, at temperatures less than about 35° C. In some embodiments, both the deposition of oxidizable material and oxidation of oxidizable material may be performed at an elevated temperature, for example, higher than 35° C., preferably higher than 100° C. In some embodiments, natural oxidation (i.e., step 420) may involve exposing the deposited material to substantially pure oxygen or a mixture of oxygen with other gases (e.g., 2-80% oxygen in nitrogen), at a relatively higher pressure (e.g., between about 0.15 to 10 milli-Torr) for a relatively longer time (e.g., up to about a few thousand seconds, preferably about 100-2000 seconds), at temperatures less than about 35° C. It should be noted that natural oxidation (in steps 420, 440, 460) is typically performed in an enclosed chamber (e.g., an oxidation chamber, deposition chamber, etc.) since oxidizing the deposited material by exposing to clean-room room air may not be a preferred option during IC fabrication (for example, to prevent defective devices due to contamination, etc.).

Natural oxidation causes the deposited oxidizable material to be slowly converted to a relatively dense and pin-hole free oxide. However, the rate of oxidation (or oxidation rate) during natural oxidation is slow and it further decreases with oxide thickness since oxide growth is limited by the rate at which oxygen ions diffuse into the growing oxide film. Therefore, in some embodiments, in addition to natural oxidation, or in place of natural oxidation, one or more of steps 420, 440, and 460 may include plasma oxidation. In embodiments where only plasma oxidation is used, the deposited oxidizable material (in one or more of steps 410, 430, 450) is oxidized using plasma oxidation. In embodiments where plasma oxidation is used in addition to natural oxidation, the deposited oxidizable material (in one or more of steps 410, 430, 450) is first oxidized by natural oxidation and then subjected to plasma oxidation. In some embodiments, plasma oxidation may be carried out in an oxidation chamber having an ion beam source that generates plasma. Plasma oxidation techniques may include, for example, ion beam oxidation, remote plasma oxidation, radical or atomic oxidation, substrate RF plasma oxidation, etc. Since plasma oxidation is well known in the art, it is not described in detail herein.

Though not a requirement, in some embodiments, plasma oxidation may be carried out by exposing the oxidizable material layer (or the naturally oxidized layer) to a process gas comprising substantially pure oxygen or a mixture of oxygen with other gases (e.g., approximately 2-50% oxygen in nitrogen ($N_2$), argon (Ar), xenon (Xe), krypton (Kr), etc.) at a pressure of about 0.1-50 milli-Torr. In some embodiments, an RF plasma generator operating at about 13.56 Mega-Hertz at about 50-500 Watts (or about 50-200 Watts) may be used to generate the plasma. However, different pressure and generator operating conditions may also be used. During plasma oxidation, the plasma excites the oxygen ions in the process gas so that oxidation of any remaining oxidizable material in the deposited oxidizable material layer occurs at a much faster rate as compared to natural oxidation. In some embodiments, the oxidation rate during plasma oxidation may be at least about twice (or at least about ten times, or at least about 100 times) the oxidation rate during natural oxidation. A higher oxidation rate is desirable to decrease throughput time. In some embodiments, higher temperature thermal oxidation, high pressure oxidation, anodic oxidation, etc., may be used in addition to, or in place of plasma oxidation.

In some preferred embodiments of the current disclosure, the process of forming intermediate region 30 (as described with reference to FIG. 4) may be modified to include a nitrogen treatment as described below. As will explained in more detail below, in general, the modification may include performing a nitrogen treatment at any step during the formation of intermediate region 30. In some embodiments, nitrogen treatment may be performed after oxidizing a deposited layer (first layer, second layer, and/or third layer) of oxidizable material. With reference to FIG. 4, in general, nitrogen treatment may be performed on an oxidized layer after some or all of steps 420, 440, and 460. FIG. 5A is a flow chart of an exemplary method of forming intermediate region 30 (i.e., step 330 of FIG. 3) where a nitrogen treatment (step 425) is performed after oxidizing the first layer of deposited oxidizable material in step 420. That is, after depositing a first layer of oxidizable material in step 410, and oxidizing the deposited layer in step 420, the oxidized material is subjected to nitrogen treatment (in step 425). Nitrogen treatment (step 425) may include exposing the surface of the oxidized first layer to an atmosphere containing nitrogen (e.g., atmosphere of substantially pure nitrogen or nitrogen mixed with other gases). In some embodiments, the surface of the oxidized first layer may be exposed to a flow of nitrogen gas (e.g., substantially pure nitrogen gas) having a flow rate of about 1-10 sccm for, for example, about 10-300 seconds. In some embodiments, in step 425, the surface of the oxidized first layer may be exposed to a plasma of argon (Ar) or xenon (Xe), krypton (Kr) with nitrogen (e.g., in an argon, krypton or xenon plasma including less than or equal to about 15% nitrogen). In some embodiments, nitrogen treatment may be performed after the oxidation step (i.e., step 420) without breaking the vacuum between the oxidation and the nitrogen treatment. The oxidation and nitrogen treatment (i.e., steps 420 and 425) may be performed in the same vacuum chamber (e.g., deposition chamber, oxidation chamber, etc.) or in different vacuum chambers. For example, after performing the oxidation in one vacuum chamber, the samples may be transferred to another vacuum chamber without breaking the vacuum (e.g., via a transfer chamber) to minimize or avoid contaminating the sample.

After the nitrogen treatment (i.e., step 425), a second layer of oxidizable material is deposited (step 430) on the nitrogen treated surface of the oxidized first layer and oxidized (step 440). A third layer of oxidizable material is then deposited (step 450) on the oxidized second layer and oxidized (step 460). Since steps 410, 420, 430, 440, 450, and 460 of FIG. 5A are similar to those described with reference to FIG. 4, they are not described again. In some embodiments, as illustrated in FIG. 5A, nitrogen treatment (i.e., step 425) will be performed only after oxidizing the first layer of oxidizable material (in step 420) and not after oxidation steps 440 and 460. However, this is not a requirement. In general, the nitrogen treatment step may be performed after any or all oxidation steps. In some embodiments, the nitrogen treatment will be performed only after step 440 and not after steps 420 and 460, and in some embodiments, the nitrogen treatment may be performed only after step 460 and not after steps 420 and 440. Similarly in some embodiments, nitrogen treatment may be performed after multiple oxidation steps (e.g., after each of steps 420 and 440 but not after step 460, after each of steps 420 and 460 but not after step 440, after each of steps 440 step 460 but not after step 420, after each of steps 420, 440, and 460, etc.).

Alternatively, or additionally, in some embodiments, nitrogen treatment may be performed on a deposited layer of oxidizable material prior to oxidizing the deposited layer. For example, with reference to FIG. 4, nitrogen treatment may be performed after some or all of steps 410 (prior to step 420), 430 (prior to step 440), and 450 (prior to step 460). FIG. 5B is a flow chart of an exemplary method of forming intermediate region 30 (i.e., step 330 of FIG. 3) where nitrogen treatment (step 435) is performed after depositing (or forming) the second layer of oxidizable material in step 430. The nitrogen treatment (step 435) may be performed in a similar manner as described in step 425 with reference to FIG. 5A. After nitrogen treatment, the nitrogen treated layer of oxidizable material is oxidized (in step 440) and the third layer of oxidizable material is deposited (step 450) and oxidized (step 460). Since steps 410, 420, 430, 440, 450, and 460 of FIG. 5B are similar to that described with reference to FIG. 4, they are not described again.

In some embodiments, as illustrated in FIG. 5B, nitrogen treatment (i.e., step 435) will be performed only after depositing the second layer of oxidizable material (in step 430) and not after depositing the first and third layer of oxidizable materials (in steps 410 and 450 respectively). However, this is not a requirement. In general, the nitrogen treatment step may be performed after depositing any or all the layers of oxidizable material. In some embodiments, the nitrogen treatment will be performed only after step 410 and not after steps 430 and 450, and in some embodiments, the nitrogen treatment may be performed only after step 450 and not after steps 410 and 430. Similarly in some embodiments, nitrogen treatment may be performed after multiple deposition steps (e.g., after each of steps 410 and 430 but not after step 450, after each of steps 430 and 450 but not after step 410, after each of steps 410 and 450 but not after step 450, after each of steps 410, 430, and 450, etc.). In some embodiments, nitrogen treatment may be performed after depositing any or all the layers of oxidizable material (i.e., after steps 410, 430, and/or 450) and/or after oxidizing any or all of the deposited layers (i.e., after steps 420, 440, and/or 460).

Alternatively or additionally, in some embodiments, the nitrogen treatment may include depositing one or more layers of the oxidizable material with nitrogen (e.g., sputter deposited in an atmosphere containing nitrogen). For example, with reference to FIG. 4, the layer of oxidizable material in any or all of steps 410, 430, and 440 may be deposited (e.g., sputter deposited) in an atmosphere of nitrogen, such as, for example, argon and nitrogen (Ar and $N_2$), krypton and nitrogen (Kr and $N_2$), xenon and nitrogen (Xe and $N_2$), etc. In some embodiments, the concentration of nitrogen ($N_2$) in the gas mixture (i.e., Ar and $N_2$, Kr and $N_2$, Xe and $N_2$, etc.) may be about 0.5-30%, preferably 1-20%. FIG. 5C is a flow chart of an exemplary method of forming intermediate region 30 (i.e., step 330 of FIG. 3) where the nitrogen treatment includes depositing the first layer of oxidizable material in a nitrogen containing atmosphere (step 410*a*). Analysis (e.g., EDX analysis) of the deposited layer may indicate the presence of nitrogen in a matrix of the oxidizable material. After depositing the first layer of oxidizable material in a nitrogen containing atmosphere, the second and third layers are deposited and oxidized (in steps 420-460) as described with reference to FIG. 4. Since these steps 420-460 are similar to that in FIG. 4, they are not described again. In some embodiments, as illustrated in FIG. 5C, the nitrogen treatment of intermediate region 30 may include depositing only the first layer of oxidizable material in an atmosphere containing nitrogen (i.e., step 410*a*). That is, the second and third layers are not deposited in at atmosphere containing nitrogen. However, this is not a requirement. In general, any or all of the layers of oxidizable materials (i.e., first layer, second layer, third layer, etc.) may be deposited in an atmosphere containing nitrogen. In some embodiments, in addition to depositing one or more oxidizable material layers in a nitrogen containing atmosphere (e.g., as described with reference to FIG. 5C), nitrogen treatment may be performed after depositing any or all the oxidizable material layers (e.g., as described above with reference to FIG. 5B), and/or after oxidizing any or all of the deposited layers (e.g., as described above with reference to FIG. 5A).

As explained previously, intermediate region 30 functions as the tunnel barrier of MTJ bit 100 (of FIG. 1). It is believed that the nitrogen treatment of the intermediate region 30 as described above (e.g., step 425 of FIG. 5A, step 435 of FIG. 5B, step 410A of FIG. 5C, etc.) leads to a longer oxidation time (e.g., while oxidizing the layers of oxidizable material) of the tunnel barrier for a given tunneling resistance (or resistance area product, RA). A longer oxidation time may result in a reduced number of short or partial short MTJ bits. Nitrogen treatment of the intermediate region 30 may also reduce the RA and hence the switching voltage ($V_c$) of an MTJ bit, thus increasing reliability and endurance characteristics of the MTJ bits.

Figure 6A:
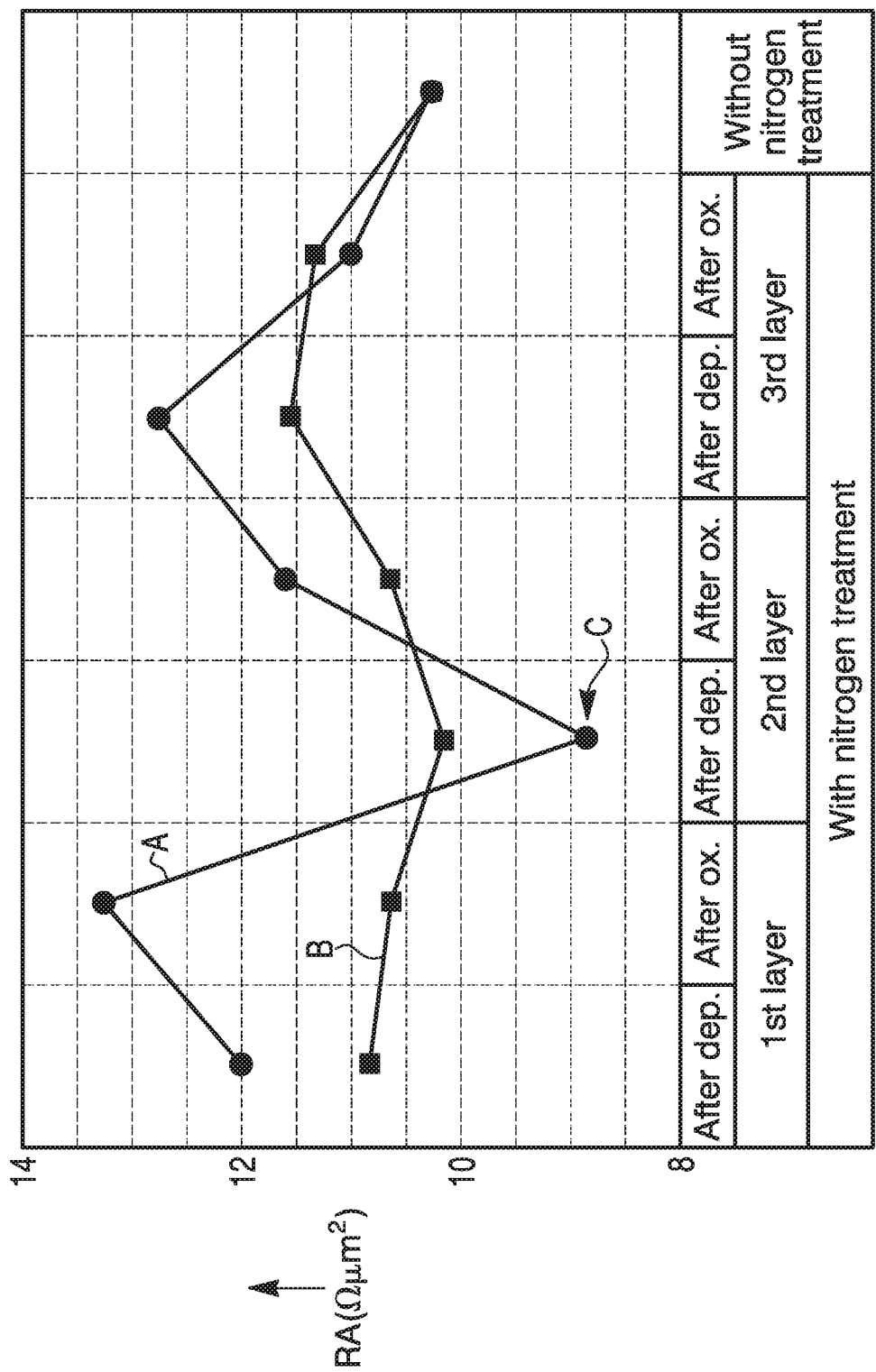
Figure 6B:
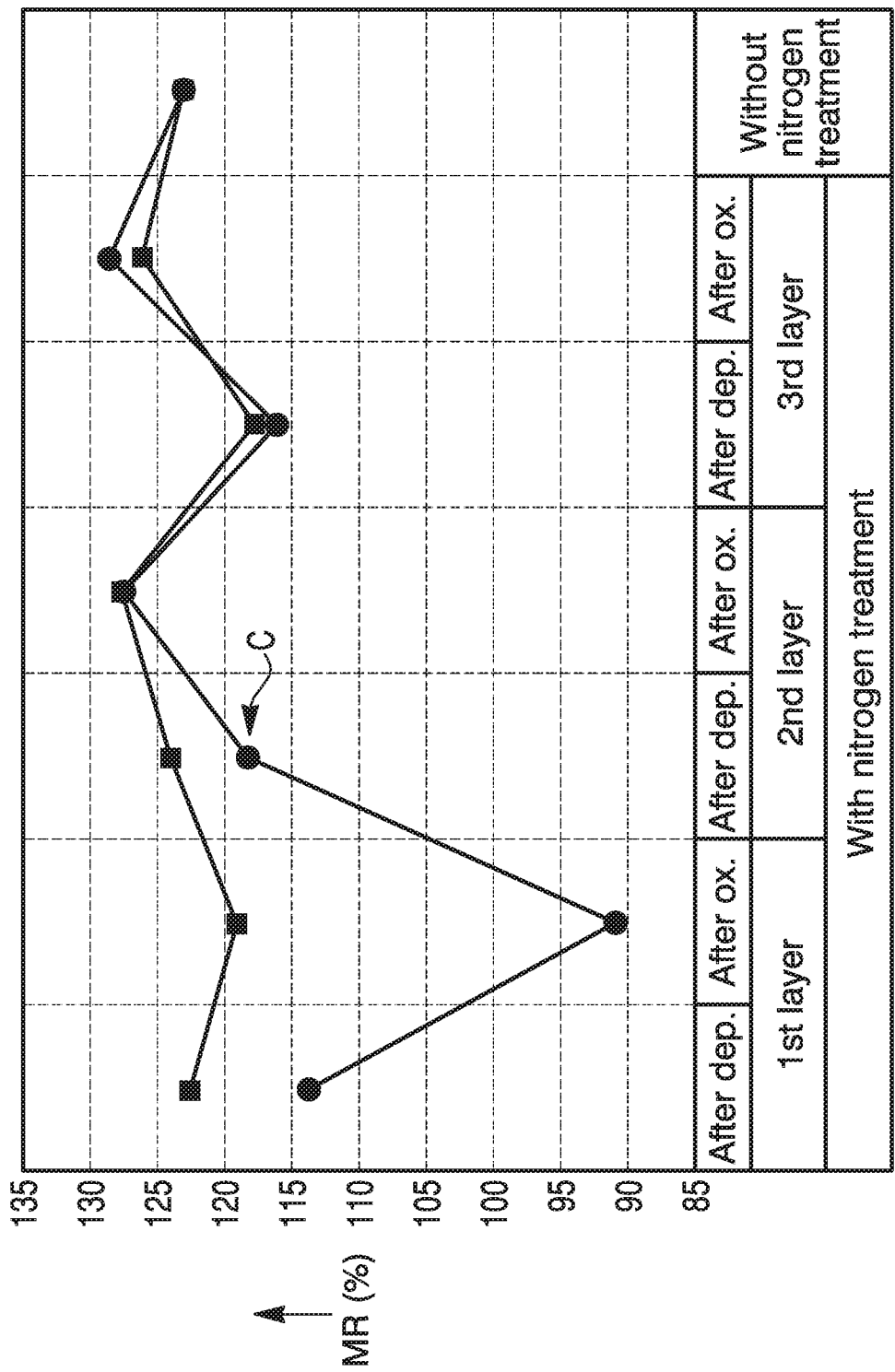

FIGS. 6A and 6B compare the observed tunneling resistance (RA) and the magnetoresistance ratio (MR), respectively, of a magnetoresistive stack that was not subjected to nitrogen treatment with magnetoresistive stacks that were subjected to different types of nitrogen treatment. In these figures, the two curves represent two types of nitrogen treatment studied. Specifically, the curve marked "A" plots (solid circle) the results of samples exposed to a flow of nitrogen gas at a flow rate of about 1 sccm for about 60 seconds, and the curve marked "B" plots (solid square) the results of samples exposed to a nitrogen containing argon plasma (e.g., about 3.5% $N_2$ concentration). The x-axis of these figures identify the region of the magnetoresistive stack that the above-described nitrogen treatment was applied to. For example, starting from the left to the right in FIGS. 6A and 6B, the first set (or the left-most set) of results were observed when nitrogen treatment was applied to the first layer of oxidizable material (e.g., between steps 410 and 420 in FIG. 5A), and the next set of results were observed when the nitrogen treatment was applied after oxidizing the deposited first layer of oxidizable material (e.g., step 425 in FIG. 5A), etc. The oxidizable material used in these studies was magnesium. As can be seen from these two figures, applying nitrogen treatment after depositing the second layer of oxidizable material (result marked "C" in FIGS. 6A and 6B) leads to lower RA with minimal change in MR (compared to the case where no nitrogen treatment as applied). This indicates that with nitrogen treatment at certain region during tunnel barrier (intermediate region) fabrication process, the oxidation rate can be further reduced. For example, the results marked with "C" have low RA and no change in MR with nitrogen treatment. This low RA tunnel barrier process may result in low switching voltage and hence improve reliability and endurance of MTJ devices.

Figure 6C:
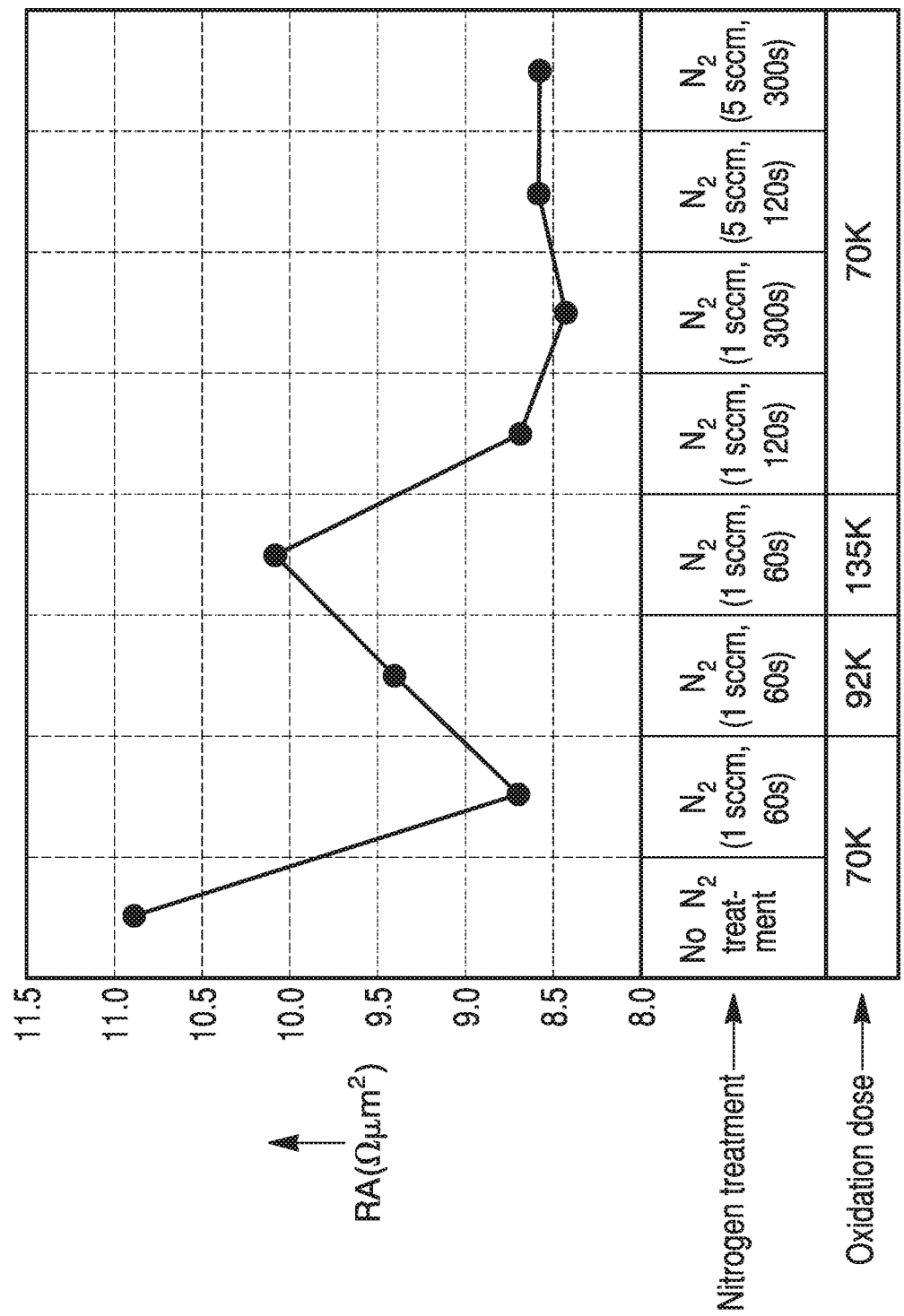
Figure 6D:
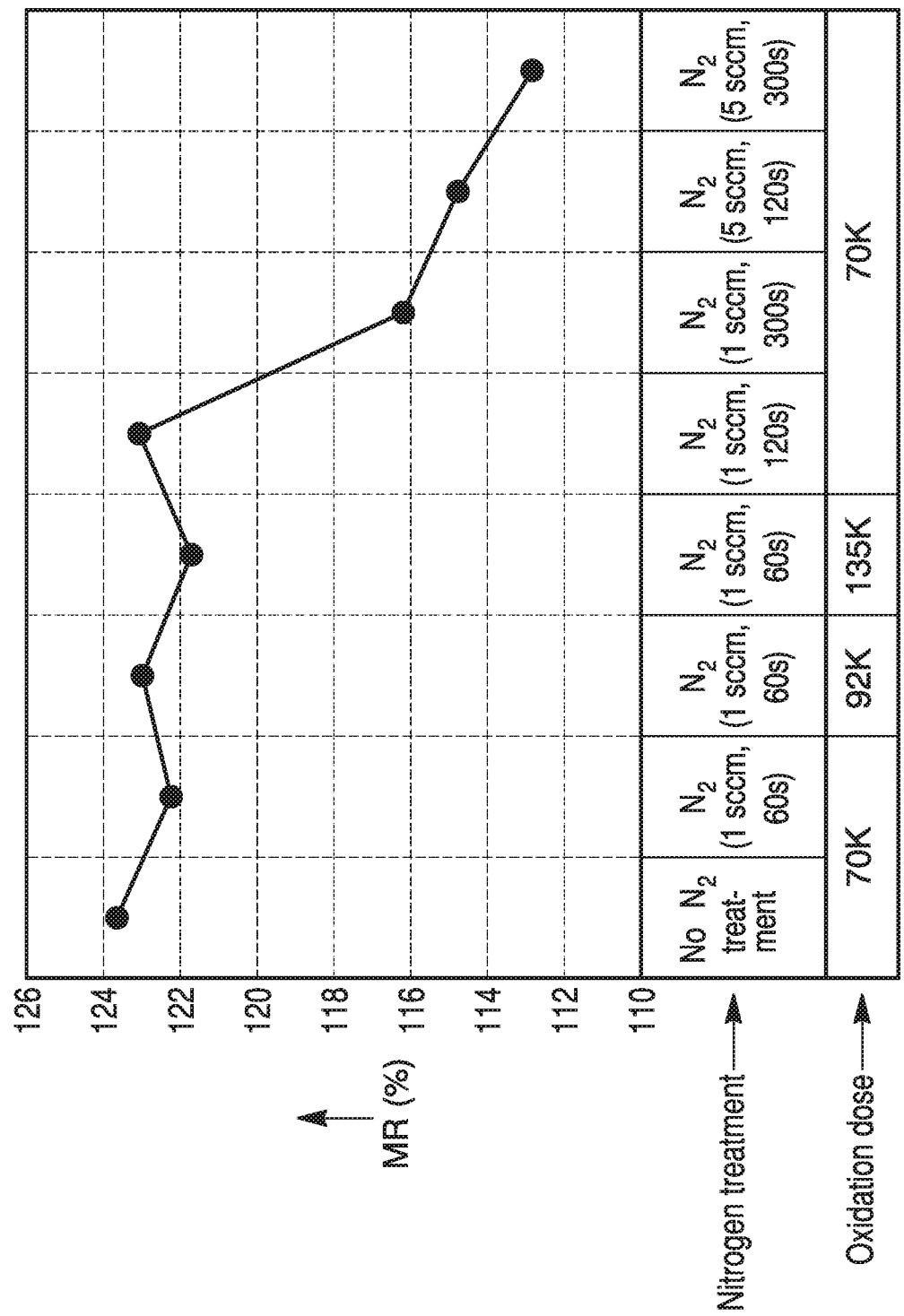

In FIGS. 6A and 6B, the results marked "C" are the RA and MR of a sample that was exposed to nitrogen gas, at a flow rate of about 1 sccm for about 60 seconds, after depositing the second layer of oxidizable material (i.e., step 435 of FIG. 5B). FIGS. 6C and 6D plot the RA and MR, respectively, of samples that were exposed to different levels of nitrogen treatment (e.g., flow rate of nitrogen and time of exposure) after depositing the second layer of oxidizable material (i.e., step 435 of FIG. 5B). The x-axis labels "$N_2$ (1 sccm, 60 s)" indicates that the sample was exposed to a flow of substantially pure nitrogen gas at a flow rate of about 1 sccm for about 60 seconds. The other nitrogen treatment labels similarly indicated different nitrogen flow rate and/or exposure times. The effect of oxidation dose during oxidation of the second layer of oxidizable material (i.e., in step 440) is also shown in FIGS. 6C and 6D. With respect to the oxidation dose, an oxidation dose of "70K" indicates that, after nitrogen treating the second layer of oxidizable material in step 435, the treated layer was oxidized in step 440 using an oxidation dose (i.e., oxygen flow rate X exposure time) of 70,000 sccm×s. Other oxidation dose values similarly indicate different oxidation doses during the oxidation of the nitrogen treated second layer of oxidizable material. The results of FIGS. 6A-6D indicate that nitrogen treatment allows for longer oxidation to form the tunnel barrier for a given RA product and thus may lead to a reduced number of short or partial short MTJ bits. As can be seen from these results, with nitrogen treatment, RA is lower. The oxidation dose with nitrogen treatment of 1 sccm and 60 s is increased to about two times as high as that without nitrogen treatment for the same targeted RA of MTJ stack. With further increasing nitrogen treatment time or flow rate, RA is similar to that with 1 sccm and 60 s, but the MR is slightly low when the nitrogen treatment dose is high.

Figure 6E:
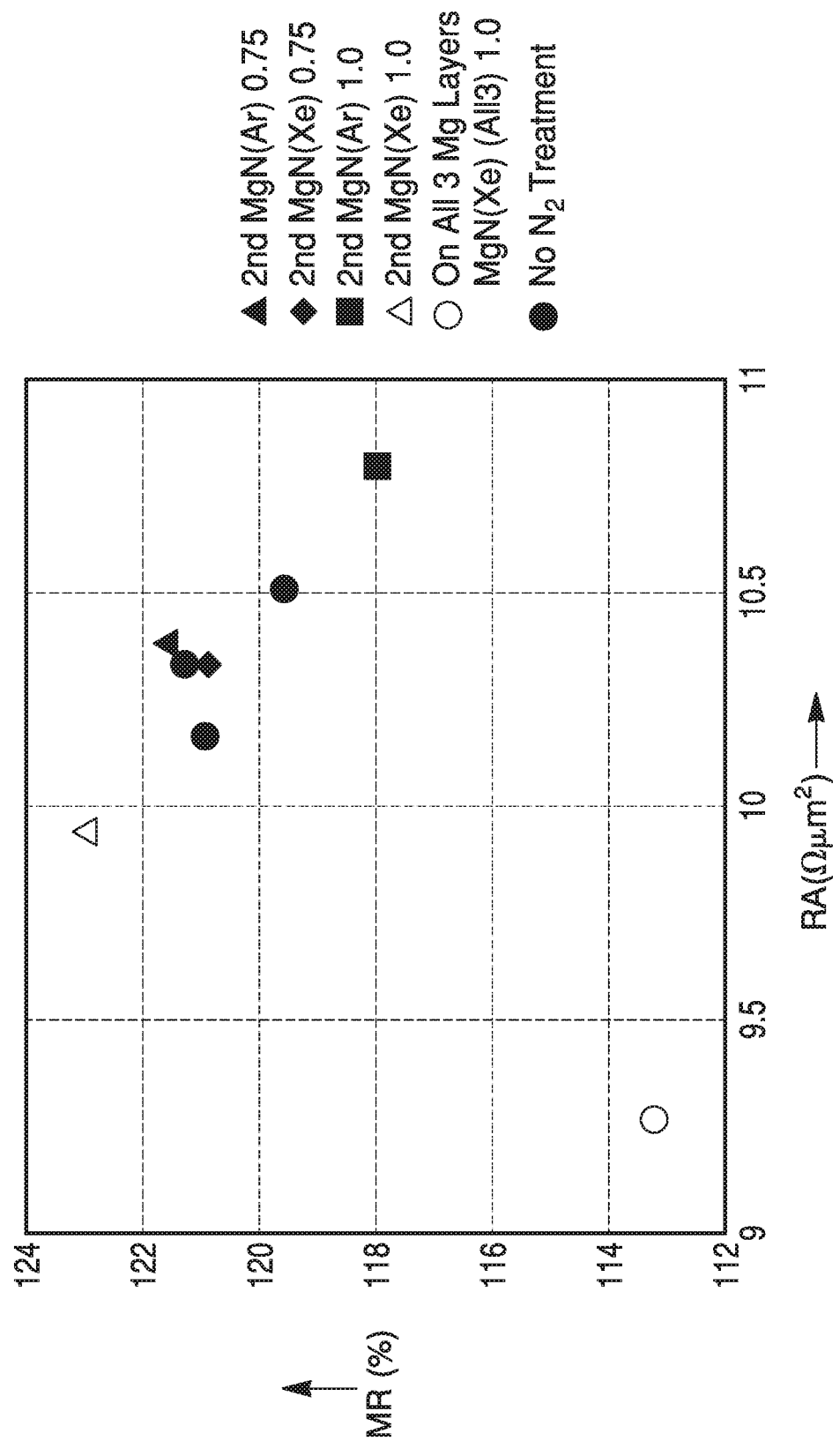

FIG. 6E compares the MR and RA of samples that were nitrogen treated by depositing (magnetron sputter deposition) a layer of oxidizable material in a nitrogen containing atmosphere. That is, the oxidizable material in one or more of steps 410A, 430, 450 of FIG. 5C was deposited in a nitrogen containing atmosphere. In FIG. 6E, the label "2nd MgN(Ar) 0.75" indicates that magnesium was deposited as the second layer of oxidizable material (i.e., step 430 of FIG. 5C), and it was deposited in an argon (Ar) plasma that included nitrogen at a flow rate of 0.75 sccm. Similarly, the label "MgN(Xe) (Al13) 1.0" indicates that magnesium was deposited as the first, second, and third layers of oxidizable material (i.e., steps 410A, 430, 450 of FIG. 5C), and each of these layers was deposited in an xenon (Xe) plasma that included nitrogen at a flow rate of 1 sccm. The nitrogen concentration is about 1-30%, preferably 1-20% in Ar—$N_2$, Kr—$N_2$ or Xe—$N_2$ mixtures. As can be seen in FIG. 6E, magnesium deposition with argon and nitrogen and magnesium deposition with xenon and nitrogen has a similar effect. FIG. 6E indicates that oxidizable material deposition with nitrogen containing argon or xenon plasma leads to low RA, and therefore will allow the oxidation dose (that is used to oxidize the oxidizable material) to be increased for the same RA, which leads to a reduced number of short or partial short MTJ bits. It should be noted that MR can be optimized by adjusting the $N_2$ partial pressure.

The results of FIGS. 6A-6E indicate that introducing a nitrogen treatment step during the fabrication of intermediate region 30 (which acts as a tunnel barrier in an MTJ device) may lead to lower RA and hence lower switching voltage ($V_c$) for better reliability and endurance without increasing short or partial short bits. The nitrogen treatment process may lead to a longer oxidation to form the intermediate region for a given RA and therefore result in a lower number of short or partial short MTJ bits.

As illustrated in FIGS. 1 and 2A, in some embodiments, after formation of intermediate region 30, free region 50 may be deposited on the intermediate region 30. In some embodiments, one or more barrier layers may be deposited on or above the intermediate region 30, and the free region 50 formed on or above the barrier layer. FIG. 7 illustrates an exemplary MTJ bit 100''' having a barrier region 40 formed between the intermediate region 30 and free region 50. In general, barrier region 40 may comprise one or more layers of material. In some embodiments, the barrier region 40 may reduce or prevent nitrogen from the intermediate region 30 from migrating into the free region 50. The barrier region 40 may have any thickness (e.g., from about 0.25 Å to about 5.0 Å, and preferably about 0.5 Å to about 2.0 Å) and may be formed of any material (such as, for example, Mg, Al, Si, Ga, In, Ta, Hf, Ta, B, C, Zr, Ti, Cr, Nb, V, Mo, W, Ru Pt, Os, Fe, FeB, CoFeB, Co, CoB, and combination thereof, or their oxides). In some embodiments, after formation of MTJ bit 100''', barrier region 40 (of FIG. 7) may comprise a nitride (e.g., of the material used to form region 40) due to nitrogen diffusion. Similarly, in some embodiments, an interfacial layer similar to barrier layer 40 may be deposited between fixed region 20 and intermediate region 30. In some embodiments, barrier region 40 may be eliminated.

Although the MTJ devices described above have a bit structure with a single tunnel barrier layer (i.e., a single intermediate region 30 as shown in FIG. 1), similar improvements are expected from embodiments having a dual spin filter structure with two tunnel barrier layers (see, e.g., FIG. 2B). In some embodiments, a single MTJ (one free region and one fixed region) may include a second intermediate region between free region 50 and top electrode 70 (e.g., intermediate region 30B of FIG. 2B, in which top electrode 70 is not pictured but may be formed above fixed region 20B). With reference to FIG. 2B, in some embodiments, the second intermediate region 30B may have smaller RA than the first intermediate region 30A, but may maintain good magnetic properties of free region 50 due to less interdiffusion between free region 50 and second intermediate region 30B. In the case of a perpendicular MTJ, the free region 50, interfaced with second intermediate region 30B instead of top electrode region 70, generates perpendicular magnetic anisotropy. In some embodiments, the second intermediate region 30B may also be formed by incorporating nitrogen treatment in the fabrication process (as described with reference to intermediate region 30 of FIG. 1). This nitrogen treatment of second intermediate region 30B may improve the quality of the second intermediate region 30B.

As alluded to above, MTJ bits of the current disclosure may be implemented in a sensor architecture or a memory architecture (among other architectures). For example, in a memory configuration, the MTJ bits may be electrically connected to an access transistor and configured to couple or connect to various conductors, which may carry one or more control signals, as shown in FIG. 8. The MTJ bits of the current disclosure may be used in any suitable application, including, e.g., in a memory configuration. In such instances, the MTJ bits may be formed as an integrated circuit comprising a discrete memory device (e.g., as shown in FIG. 9A) or an embedded memory device having a logic therein (e.g., as shown in FIG. 9B), each including MRAM, which, in one embodiment is representative of one or more arrays of MRAM having a plurality of MTJ bits, according to certain aspects of certain embodiments disclosed herein.

In one or more aspects, a magnetoresistive device is disclosed. The device may include a first ferromagnetic region, a second ferromagnetic region, and an intermediate region positioned between the first ferromagnetic region and the second ferromagnetic region. The intermediate region may be formed of a dielectric material and include nitrogen.

In various embodiments the device may alternatively or additionally include one or more of the following additional aspects: the dielectric material may include one of magnesium oxide or aluminum oxide; the first ferromagnetic region may be a fixed magnetic region of the magnetoresistive device; the first ferromagnetic region may include at least two ferromagnetic layers separated by an antiferromagnetic coupling layer; the first ferromagnetic region may include at least two ferromagnetic layers separated by an antiferromagnetic coupling layer and the second ferromagnetic region may be a free magnetic region of the magnetoresistive device.

In one or more aspects, a method of manufacturing a magnetoresistive device is disclosed. The method may include forming a first ferromagnetic region, forming an intermediate region on or above the first ferromagnetic region. Wherein, the intermediate region may be formed of a dielectric material and include nitrogen. The method may also include forming a second ferromagnetic region on or above the intermediate region.

In various embodiments the device may alternatively or additionally include one or more of the following additional aspects: forming the intermediate region may include (a) depositing an oxidizable material on or above the first ferromagnetic region, (b) oxidizing the deposited oxidizable material to form an at least partially oxidized material, and (c) performing a nitrogen treatment on the at least partially oxidized material, and the nitrogen treatment may include exposing the at least partially oxidized material to an atmosphere including nitrogen; forming the intermediate region may include (a) depositing an oxidizable material on or above the first ferromagnetic region, (b) oxidizing the deposited oxidizable material to form an at least partially oxidized material, and (c) performing a nitrogen treatment on the at least partially oxidized material, and the nitrogen treatment may include exposing the at least partially oxidized material to substantially pure nitrogen having a flow rate of about 1-10 sccm for a time of about 10-300 seconds; forming the intermediate region may include (a) depositing an oxidizable material on or above the first ferromagnetic region, (b) oxidizing the deposited oxidizable material to form an at least partially oxidized material, and (c) performing a nitrogen treatment on the at least partially oxidized material, and the nitrogen treatment may include exposing the at least partially oxidized material to a plasma of argon, krypton, or xenon including less than or equal to about 15% nitrogen; forming the intermediate region may include (a) depositing an oxidizable material on or above the first ferromagnetic region, (b) performing a nitrogen treatment on the deposited oxidizable material, and (c) oxidizing the deposited oxidizable material after the nitrogen treatment to form an at least partially oxidized material, and the nitrogen treatment may include exposing the at least partially oxidized material to an atmosphere including nitrogen; forming the intermediate region may include (a) depositing an oxidizable material on or above the first ferromagnetic region, (b) performing a nitrogen treatment on the deposited oxidizable material, and (c) oxidizing the deposited oxidizable material after the nitrogen treatment to form an at least partially oxidized material, and the nitrogen treatment may include exposing the at least partially oxidized material to substantially pure nitrogen gas having a flow rate of about 1-10 sccm for a time of about 10-300 seconds; forming the intermediate region may include (a) depositing an oxidizable material on or above the first ferromagnetic region, (b) performing a nitrogen treatment on the deposited oxidizable material, and (c) oxidizing the deposited oxidizable material after the nitrogen treatment to form an at least partially oxidized material, and the nitrogen treatment may include exposing the at least partially oxidized material to a plasma of argon, krypton, or xenon including less than or equal to about 15% nitrogen; forming the intermediate region may include (a) depositing an oxidizable material on or above the first ferromagnetic region, and (b) oxidizing the deposited oxidizable material to form an at least partially oxidized material, and depositing the oxidizable material may include depositing the oxidizable material in an atmosphere including nitrogen.

In various embodiments the device may alternatively or additionally include one or more of the following additional aspects: forming the intermediate region may include (a) depositing an oxidizable material on or above the first ferromagnetic region, and (b) oxidizing the deposited oxidizable material to form an at least partially oxidized material, and depositing the oxidizable material may include depositing the oxidizable material in a plasma of argon, xenon, or krypton, including about 0.5-30% nitrogen; forming the intermediate region may include (a) depositing a first layer of an oxidizable material on or above the first ferromagnetic region, (b) oxidizing the deposited first layer to form an at least partially oxidized first layer, (c) depositing a second layer of an oxidizable material on or above the at least partially oxidized first layer, (d) oxidizing the deposited second layer to form an at least partially oxidized second layer, (e) depositing a third layer of an oxidizable material on or above the at least partially oxidized second layer, (f) oxidizing the deposited third layer to form an at least partially oxidized third layer, and (g) performing a nitrogen treatment on at least one of (i) the at least partially oxidized first layer prior to depositing the second layer, (ii) the at least partially oxidized second layer prior to depositing the third layer, and (iii) the at least partially oxidized third layer, and the nitrogen treatment may include at least one of: exposing a partially oxidized layer to nitrogen having a flow rate of about 1-10 sccm for a time of about 10-300 seconds, or exposing a partially oxidized layer to a plasma of argon, krypton, or xenon including less than or equal to about 15% nitrogen; forming the intermediate region may include (a) depositing a first layer of an oxidizable material on or above the first ferromagnetic region, (b) oxidizing the deposited first layer to form an at least partially oxidized first layer, (c) depositing a second layer of an oxidizable material on or above the at least partially oxidized first layer, (d) oxidizing the deposited second layer to form an at least partially oxidized second layer, (e) depositing a third layer of an oxidizable material on or above the at least partially oxidized second layer, (f) oxidizing the deposited third layer to form an at least partially oxidized third layer, and (g) performing a nitrogen treatment on at least one of (i) the deposited first layer prior to oxidizing the deposited first layer, (ii) the deposited second layer prior to oxidizing the deposited second layer, and (iii) the deposited third layer prior to oxidizing the deposited third layer, and the nitrogen treatment may include at least one of: exposing a deposited layer to nitrogen having a flow rate of about 1-10 sccm for a time of about 10-300 seconds, or exposing a deposited layer to a plasma of argon, krypton, or xenon including less than or equal to about 15% nitrogen; forming the intermediate region may include (a) depositing a first layer of an oxidizable material on or above the first ferromagnetic region, (b) oxidizing the deposited first layer to form an at least partially oxidized first layer, (c) depositing a second layer of an oxidizable material on or above the at least partially oxidized first layer, (d) oxidizing the deposited second layer to form an at least partially oxidized second layer, (e) depositing a third layer of an oxidizable material on or above the at least partially oxidized second layer, and (f) oxidizing the deposited third layer to form an at least partially oxidized third layer, and at least one of deposing the first layer, depositing the second layer, or depositing the third layer may include depositing the oxidizable material in a plasma of argon, xenon, or krypton, including about 0.5-30% nitrogen; and the dielectric material may include one of magnesium oxide or aluminum oxide.

In one or more aspects, a method of manufacturing a magnetoresistive device is disclosed. The method may include forming a first ferromagnetic region, forming an intermediate region on or above the first ferromagnetic region, wherein forming the intermediate region may includes (a) depositing a first layer of an oxidizable material on or above the first ferromagnetic region; (b) oxidizing the deposited first layer to form an at least partially oxidized first layer; (c) depositing a second layer of an oxidizable material on or above the at least partially oxidized first layer; (d) oxidizing the deposited second layer to form an at least partially oxidized second layer; (e) depositing a third layer of an oxidizable material on or above the at least partially oxidized second layer; (f) oxidizing the deposited third layer to form an at least partially oxidized third layer; and (g) performing at least one of: (i) depositing the first layer of oxidizable material in step (a) in a plasma of argon, xenon, or krypton, including about 0.5-30% nitrogen; (ii) depositing the second layer of oxidizable material in step (c) in a plasma of argon, xenon, or krypton, including about 0.5-30% nitrogen; (iii) depositing the third layer of oxidizable material in step (e) in a plasma of argon, xenon, or krypton, including about 0.5-30% nitrogen; (iv) exposing the deposited first layer to an atmosphere including nitrogen prior to oxidizing the deposited first layer in step (b); (v) exposing the deposited second layer to an atmosphere including nitrogen prior to oxidizing the deposited second layer in step (d); (vi) exposing the deposited third layer to an atmosphere including nitrogen prior to oxidizing the deposited third layer in step (f); (vii) exposing the at least partially oxidized first layer to an atmosphere including nitrogen prior to depositing the second layer in step (c); (viii) exposing the at least partially oxidized second layer to an atmosphere including nitrogen prior to depositing the third layer in step (e); and (ix) exposing the at least partially oxidized third layer to an atmosphere including nitrogen after step (f).

In various embodiments the device may alternatively or additionally include one or more of the following additional aspects: exposing a layer to an atmosphere including nitrogen in steps (iv)-(ix) may include exposing the layer to nitrogen having a flow rate of about 1-10 sccm for a time of about 10-300 seconds, or exposing the layer to a plasma of argon, krypton, or xenon including less than or equal to about 15% nitrogen.

Although various embodiments of the present disclosure have been illustrated and described in detail, it will be readily apparent to those skilled in the art that various modifications may be made without departing from the present disclosure or from the scope of the appended claims.

What is claimed is:

1. A magnetoresistive device, comprising:
   a first ferromagnetic region;
   a second ferromagnetic region; and
   an intermediate region positioned between the first ferromagnetic region and the second ferromagnetic region, wherein the intermediate region is formed of a dielectric material and includes nitrogen,
   wherein the intermediate region includes (a) an oxidizable material on or above the first ferromagnetic region, and (b) the oxidizable material forms an at least partially oxidized material, and
   wherein the oxidizable material is deposited in an atmosphere including nitrogen.

2. The device of claim 1, wherein the dielectric material includes one of magnesium oxide or aluminum oxide.

3. The device of claim 1, wherein the first ferromagnetic region is a fixed magnetic region of the magnetoresistive device.

4. The device of claim 1, wherein the first ferromagnetic region includes at least two ferromagnetic layers separated by an antiferromagnetic coupling layer.

5. The device of claim 1, wherein the first ferromagnetic region includes at least two ferromagnetic layers separated by an antiferromagnetic coupling layer, and wherein the second ferromagnetic region is a free magnetic region of the magnetoresistive device.

6. A method of manufacturing a magnetoresistive device, comprising:
   forming a first ferromagnetic region;
   forming an intermediate region on or above the first ferromagnetic region, wherein the intermediate region is formed of a dielectric material and includes nitrogen; and
   forming a second ferromagnetic region on or above the intermediate region,
   wherein forming the intermediate region includes (a) depositing an oxidizable material on or above the first ferromagnetic region, and (b) oxidizing the deposited oxidizable material to form an at least partially oxidized material, wherein depositing the oxidizable material includes depositing the oxidizable material in an atmosphere including nitrogen.

7. The method of claim 6, wherein forming the intermediate region includes performing a nitrogen treatment on the at least partially oxidized material, wherein the nitrogen treatment includes exposing the at least partially oxidized material to an atmosphere including nitrogen.

8. The method of claim 6, wherein forming the intermediate region includes performing a nitrogen treatment on the at least partially oxidized material, wherein the nitrogen treatment includes exposing the at least partially oxidized material to nitrogen having a flow rate of about 1-10 sccm for a time of about 10-300 seconds.

9. The method of claim 6, wherein forming the intermediate region includes performing a nitrogen treatment on the at least partially oxidized material, wherein the nitrogen treatment includes exposing the at least partially oxidized material to a plasma of argon, krypton, or xenon including less than or equal to about 15% nitrogen.

10. The method of claim 6, wherein forming the intermediate region includes (c) performing a nitrogen treatment on the deposited oxidizable material, and (d) oxidizing the deposited oxidizable material after the nitrogen treatment to form the at least partially oxidized material.

11. The method of claim 6, wherein forming the intermediate region includes (c) performing a nitrogen treatment on the deposited oxidizable material, and (d) oxidizing the deposited oxidizable material after the nitrogen treatment to form the at least partially oxidized material, wherein the nitrogen treatment includes exposing the at least partially oxidized material to nitrogen gas having a flow rate of about 1-10 sccm for a time of about 10-300 seconds.

12. The method of claim 6, wherein forming the intermediate region includes (c) performing a nitrogen treatment on the deposited oxidizable material, and (d) oxidizing the deposited oxidizable material after the nitrogen treatment to form the at least partially oxidized material, wherein the nitrogen treatment includes exposing the at least partially oxidized material to a plasma of argon, krypton, or xenon including less than or equal to about 15% nitrogen.

13. The method of claim 6, wherein depositing the oxidizable material includes depositing the oxidizable material in a plasma of argon, xenon, or krypton, including about 0.5-30% nitrogen.

14. The method of claim 6, wherein forming the intermediate region includes (c) depositing a first layer of an oxidizable material on or above the first ferromagnetic region, (d) oxidizing the deposited first layer to form an at least partially oxidized first layer, (e) depositing a second layer of an oxidizable material on or above the at least partially oxidized first layer, (f) oxidizing the deposited second layer to form an at least partially oxidized second layer, (g) depositing a third layer of an oxidizable material on or above the at least partially oxidized second layer, (h) oxidizing the deposited third layer to form an at least partially oxidized third layer, and (i) performing a nitrogen treatment on at least one of (i) the at least partially oxidized first layer prior to depositing the second layer, (ii) the at least partially oxidized second layer prior to depositing the third layer, and (iii) the at least partially oxidized third layer,
wherein the nitrogen treatment includes at least one of:
exposing a partially oxidized layer to nitrogen having a flow rate of about 1-10 sccm for a time of about 10-300 seconds, or
exposing a partially oxidized layer to a plasma of argon, krypton, or xenon including less than or equal to about 15% nitrogen.

15. The method of claim 6, wherein forming the intermediate region includes (c) depositing a first layer of an oxidizable material on or above the first ferromagnetic region, (d) oxidizing the deposited first layer to form an at least partially oxidized first layer, (e) depositing a second layer of an oxidizable material on or above the at least partially oxidized first layer, (f) oxidizing the deposited second layer to form an at least partially oxidized second layer, (g) depositing a third layer of an oxidizable material on or above the at least partially oxidized second layer, (h) oxidizing the deposited third layer to form an at least partially oxidized third layer, and (i) performing a nitrogen treatment on at least one of (i) the deposited first layer prior to oxidizing the deposited first layer, (ii) the deposited second layer prior to oxidizing the deposited second layer, and (iii) the deposited third layer prior to oxidizing the deposited third layer,
wherein the nitrogen treatment includes at least one of:
exposing a deposited layer to nitrogen having a flow rate of about 1-10 sccm for a time of about 10-300 seconds, or
exposing a deposited layer to a plasma of argon, krypton, or xenon including less than or equal to about 15% nitrogen.

16. The method of claim 6, wherein forming the intermediate region includes (c) depositing a first layer of an oxidizable material on or above the first ferromagnetic region, (d) oxidizing the deposited first layer to form an at least partially oxidized first layer, (e) depositing a second layer of an oxidizable material on or above the at least partially oxidized first layer, (f) oxidizing the deposited second layer to form an at least partially oxidized second layer, (g) depositing a third layer of an oxidizable material on or above the at least partially oxidized second layer, and (h) oxidizing the deposited third layer to form an at least partially oxidized third layer,
wherein at least one of deposing the first layer, depositing the second layer, or depositing the third layer includes depositing the oxidizable material in a plasma of argon, xenon, or krypton, including about 0.5-30% nitrogen.

17. The method of claim 6, wherein the dielectric material includes one of magnesium oxide or aluminum oxide.

18. A method of manufacturing a magnetoresistive device, comprising:
forming a first ferromagnetic region;
forming an intermediate region on or above the first ferromagnetic region, wherein forming the intermediate region includes:
(a) depositing a first layer of an oxidizable material on or above the first ferromagnetic region;
(b) oxidizing the deposited first layer to form an at least partially oxidized first layer;
(c) depositing a second layer of an oxidizable material on or above the at least partially oxidized first layer;
(d) oxidizing the deposited second layer to form an at least partially oxidized second layer;
(e) depositing a third layer of an oxidizable material on or above the at least partially oxidized second layer;
(f) oxidizing the deposited third layer to form an at least partially oxidized third layer; and
(g) performing at least one of:
(i) depositing the first layer of oxidizable material in step (a) in a plasma of argon, xenon, or krypton, including about 0.5-30% nitrogen;
(ii) depositing the second layer of oxidizable material in step (c) in a plasma of argon, xenon, or krypton, including about 0.5-30% nitrogen;
(iii) depositing the third layer of oxidizable material in step (e) in a plasma of argon, xenon, or krypton, including about 0.5-30% nitrogen;
(iv) exposing the deposited first layer to an atmosphere including nitrogen prior to oxidizing the deposited first layer in step (b);
(v) exposing the deposited second layer to an atmosphere including nitrogen prior to oxidizing the deposited second layer in step (d);
(vi) exposing the deposited third layer to an atmosphere including nitrogen prior to oxidizing the deposited third layer in step (f);
(vii) exposing the at least partially oxidized first layer to an atmosphere including nitrogen prior to depositing the second layer in step (c);
(viii) exposing the at least partially oxidized second layer to an atmosphere including nitrogen prior to depositing the third layer in step (e); and
(ix) exposing the at least partially oxidized third layer to an atmosphere including nitrogen after step (f).

19. The method of claim 18, wherein exposing a layer to an atmosphere including nitrogen in steps (iv)-(ix) includes exposing the layer to nitrogen having a flow rate of about 1-10 sccm for a time of about 10-300 seconds, or exposing the layer to a plasma of argon, krypton, or xenon including less than or equal to about 15% nitrogen.

* * * * *